US012575359B2

(12) United States Patent
Maegawa

(10) Patent No.: US 12,575,359 B2
(45) Date of Patent: Mar. 10, 2026

(54) SUBSTRATE TREATING APPARATUS

(71) Applicant: SCREEN Holdings Co., Ltd., Kyoto (JP)

(72) Inventor: Tadashi Maegawa, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 306 days.

(21) Appl. No.: 18/354,389

(22) Filed: Jul. 18, 2023

(65) Prior Publication Data

US 2024/0030047 A1 Jan. 25, 2024

(30) Foreign Application Priority Data

Jul. 20, 2022 (JP) ................................. 2022-115549

(51) Int. Cl.
*H01L 21/67* (2006.01)
*H01L 21/677* (2006.01)
*H01L 21/687* (2006.01)
(52) U.S. Cl.
CPC .. *H01L 21/67034* (2013.01); *H01L 21/67051* (2013.01); *H01L 21/67178* (2013.01);
(Continued)
(58) Field of Classification Search
CPC ............. H01L 21/687; H01L 21/67057; H01L 21/67178; H01L 21/67718;
(Continued)

(56) References Cited

U.S. PATENT DOCUMENTS 5,445,171 A 8/1995 Ohmori et al. .................. 134/61
6,458,012 B1 * 10/2002 Hirokawa ............... B24B 49/14
451/60
(Continued)

FOREIGN PATENT DOCUMENTS

CN 114334710 A 4/2022
CN 114334711 A 4/2022
(Continued)

OTHER PUBLICATIONS

Office Action dated Dec. 20, 2024 in corresponding Korean Patent Application No. 10-2023-0066218. English translation attached.
(Continued)

*Primary Examiner* — Benjamin L Osterhout
(74) *Attorney, Agent, or Firm* — OSTROLENK FABER LLP

(57) ABSTRACT

A substrate treating apparatus includes a batch-type processing unit configured to perform treatment on a plurality of substrates, a single-wafer-type processing unit configured to perform treatment on one substrate of the substrates at a time, a posture turning unit configured to turn and change the orientation of the substrates to be processed by the batch-type processing unit, while the substrates are wetted with deionized water, a first transport unit that transports the substrates, processed by the batch-type processing unit, to the posture turning unit, a second transport unit that transports the substrates turned horizontally by the posture turning unit to enable them to be subjected to treatment with the hand unit and a cleaning and drying unit configured to perform cleaning and drying treatment at the hand unit.

20 Claims, 18 Drawing Sheets

(52) U.S. Cl.

CPC .. *H01L 21/67718* (2013.01); *H01L 21/67757* (2013.01); *H01L 21/687* (2013.01); *H01L 21/67028* (2013.01); *H01L 21/67057* (2013.01); *H01L 21/67103* (2013.01); *H01L 21/68707* (2013.01)

(58) Field of Classification Search

CPC ......... H01L 21/67103; H01L 21/68707; H01L 21/67757; H01L 21/67028; H01L 21/67051; H01L 21/67034

See application file for complete search history.

(56) References Cited

U.S. PATENT DOCUMENTS

| | | | |
|---|---|---|---|
| 10,297,472 B2 | 5/2019 | Wang et al. | |
| 11,666,951 B2 * | 6/2023 | Liao ......................... | B08B 5/04 |
| | | | 15/93.1 |
| 2006/0137726 A1 | 6/2006 | Sano et al. ...................... | 134/61 |
| 2012/0234364 A1 * | 9/2012 | Muramoto ........ | H01L 21/67766 |
| | | | 134/104.1 |

| | | | |
|---|---|---|---|
| 2020/0251343 A1 | 8/2020 | Hirayama et al. | |
| 2021/0111038 A1 | 4/2021 | Kanagawa et al. | |
| 2021/0111054 A1 | 4/2021 | Kanagawa et al. | |

FOREIGN PATENT DOCUMENTS

| | | | | |
|---|---|---|---|---|
| CN | 117438336 A | * | 1/2024 | ....... H01L 21/67034 |
| JP | 2000068244 A | * | 3/2000 | |
| JP | 2016-502275 A | | 1/2016 | |
| KR | 10-1994-0008008 A | | 4/1994 | |
| KR | 10-2006-0073468 A | | 6/2006 | |
| KR | 10-2011-0077045 A | | 7/2011 | |
| TW | 202044383 A | | 12/2020 | |
| TW | 2021117821 A | | 5/2021 | |
| TW | 202121566 A | | 6/2021 | |

OTHER PUBLICATIONS

Office Action mailed Jun. 13, 2024 for corresponding Taiwan Patent Application No. TW 112126678. English translation attached.

Office Action dated Aug. 14, 2024 for corresponding Korean Patent Application No. KR 10-2023-0066218. English translation attached.

* cited by examiner

SUBSTRATE TREATING APPARATUS

BACKGROUND OF THE INVENTION

Field of the Invention

The present invention relates to a substrate treating apparatus for performing predetermined treatment on a substrate, such as a semiconductor substrate, a substrate for flat panel display (FPD) like liquid crystal display and organic electroluminescence (EL) display a glass substrate for photomask, and an optical disk substrate.

Description of the Related Art

Such currently used types of devices include one having a batch type module, a single-wafer-type module, a rotating mechanism, and a transport robot. See, for example, Japanese Patent Publication (Translation of PCT Application) No. 2016-502275. The batch-type module performs treatment on a plurality of substrates collectively. The single-wafer-type module performs treatment on substrates one by one. Typically, dry treatment performed by the single-wafer-type module is better in particle performance than dry treatment performed by the batch-type module, since the treatment atmosphere affecting the substrate is smaller in space. Accordingly, the single-wafer-type module achieves more enhanced dry performance than the batch-type nodule. Then, an etching treatment and a rinse treatment are performed with the batch-type module, and thereafter, a dry treatment is performed with the single-wafer-type module, for example.

In the batch-type module, treatment is performed in such a stat that the substrates are in a vertical posture. On the other hand, in the single-wafer-type module, the treatment is performed in such a state where the substrates are in a horizontal posture. Accordingly, the rotating mechanism turns the substrates in the vertical posture after the treatment by the batch it to the horizontal posture before the substrates are transported to the single-wafer-type module. Accordingly, the substrates made in a horizontal posture by the rotating mechanism rotating mechanism are transported to the single-wafer module by a transport robot. The substrates dried in the single-wafer processing module are again transported by the same transport robot for unloading.

In recent years, patterns of a three-dimensional structure have become refined increasingly in the semiconductor field. Consequently, the patterns of such substrates as above may collapse due to an effect of a gas-liquid interface when the substrates are dried. Therefore, after the treatment with the batch-type module, the substrates are made wet for not being dried until the treatment with the single-wafer-type processing is performed.

Specifically, a plurality of spray tubes are provided in the vicinity of the rotating mechanism. The spray tubes spray deionized water to the substrates held by the rotating mechanism. This makes the substrates, held by the rotating mechanism, wet until being placed on the single-wafer-type module.

However, the example of the currently-used apparatus with such a construction has the following drawback.

That is, in the currently-used apparatus, when the transport robot receives the substrates, made in the horizontal posture by the rotating mechanism, with hands, the hands get wet with deionized water. Accordingly, when the transport robot transports the substrates dried in the single-wafer module, the hands may contaminate the dried substrates.

SUMMARY OF THE INVENTION

The present invention has been made regarding the state of the art noted above, and its one object is to provide a substrate treating apparatus that performs transportation of wet substrates and that can prevent contamination in transportation of dried substrates.

The present invention is constituted as stated below to achieve the above object.

One aspect of the present invention provides a substrate treating apparatus that performs treatment on a substrate. The apparatus includes: a batch-type processing unit configured to perform treatment on a plurality of substrates in a vertical posture collectively; a single-wafer-type processing unit configured to perform treatment on one substrate of the substrates in a horizontal posture; a posture turning unit configured to hold the substrates on which the treatment is performed by the batch-type processing unit, and to turn a posture of the substrates from vertical to horizontal while the substrates get wet with deionized water; a first transport unit configured to transport the substrates, on which the treatment is performed by the batch-type processing unit, to the posture turning unit: a second transport unit configured to transport the substrates, turned to horizontal by the posture turning unit, with a hand to the single-wafer processing unit, and configured to transport the substrates, on which the treatment is performed by the single-wafer processing unit, with the hand out of the single-wafer processing unit; and a cleaning and drying unit configured to perform cleaning and drying treatment on the hand of the second transport unit.

With the aspect of the present invention, the cleaning and drying unit performs the cleaning and drying treatment on the hand of the second transport unit. As a result, the hand can be kept clean by the second transport unit. Accordingly, contamination can be prevented by the second transport unit during transportation of the dried substrates from the single-wafer processing unit while transporting wet substrates from the posture turning unit.

Moreover, it is preferred in the aspect of the present invention that the cleaning and drying unit performs the cleaning and drying treatment on the hand before the second transport unit transports the substrates, on which the treatment is performed by the single-wafer processing unit, out of the single-wafer processing unit.

The hand is not cleaned and dried every time the hand gets wet through transportation of the substrates from the posture turning unit to the single-wafer processing unit. Accordingly, cleaning and drying frequency can be reduced. This results in saved resources needed for cleaning and drying.

Moreover, it is preferred in the aspect of the present invention that the cleaning and drying unit performs the cleaning and drying treatment on the hand after the substrates are transported from the posture turning unit to the single-wafer processing unit.

The hand is cleaned and dried after getting wet through transportation of the substrates to the single-wafer processing unit. Accordingly, a period of time from when the hand gets wet to when the hand is cleaned and dried can be shortened. This can prevent residues on the hand, the residues being caused by adhered deionized water for a long period of time elapsed from when the hand gets wet. As a result, cleanness of the hand can be enhanced.

Moreover, it is preferred in the aspect of the present invention that the cleaning and drying unit is arranged above the posture turning unit.

Since the cleaning and drying unit is arranged above the posture turning unit, footprint of the apparatus can be reduced.

Moreover, it is preferred in the aspect of the present invention that an interior of the cleaning and drying unit and an interior of the posture turning unit are in fluid communication with each other in a vertical direction.

When the cleaning and drying unit performs cleaning and drying, a cleaning liquid flows downward. At the lower part, the posture turning unit is positioned that makes a plurality of substrates wet with deionized water. Consequently, a vat for receiving the cleaning liquid from the cleaning and drying unit is omittable. This simplifies the configuration of the apparatus, leading to suppressed costs.

Moreover, it is preferred in the aspect of the present invention that the cleaning and drying unit includes a cleaning liquid nozzle configured to eject a cleaning liquid to the hand, and a drying mechanism configured to dry the hand.

The hand can be cleaned and dried with the cleaning liquid nozzle and the drying mechanism.

Moreover, it is preferred in the aspect of the present invention that the drying mechanism is a gas nozzle configured to supply has to the hand.

The hand can be dried with such a relatively simple configuration.

Moreover, it is preferred in the aspect of the present invention that the single-wafer processing unit includes a spin chuck configured to support the substrate rotatably in a horizontal posture, a treatment liquid supplying mechanism configured to supply a treatment liquid to the substrate supported by the spin chuck, and a gas supplying mechanism configured to supply gas on the substrate supported by the spin chuck, and that the cleaning and drying unit performs cleaning and drying treatment to the hand with use of the treatment liquid supplying mechanism and the gas supplying mechanism of the single-wafer processing unit.

The cleaning and drying unit can also be served as the single-wafer processing unit. This simplifies the configuration of the apparatus, leading to suppressed apparatus costs.

Moreover, it is preferred in the aspect of the present invention that the substrate treating apparatus further includes a plurality of the cleaning and drying units arranged in different positions in plan view, and one of the cleaning and drying units adjacent to the hand performs cleaning and drying treatment in accordance with a position of the second transport unit.

The hand is cleaned and dried with the cleaning and drying unit adjacent thereto, leading to rapid cleaning of the hand. This can hardly generate residues due to adhered deionized water. Moreover, the substrates can be transported from the single-wafer processing unit rapidly, leading to enhanced throughput.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

The following describes one embodiment of the present invention with reference to drawings.

Figure 1:
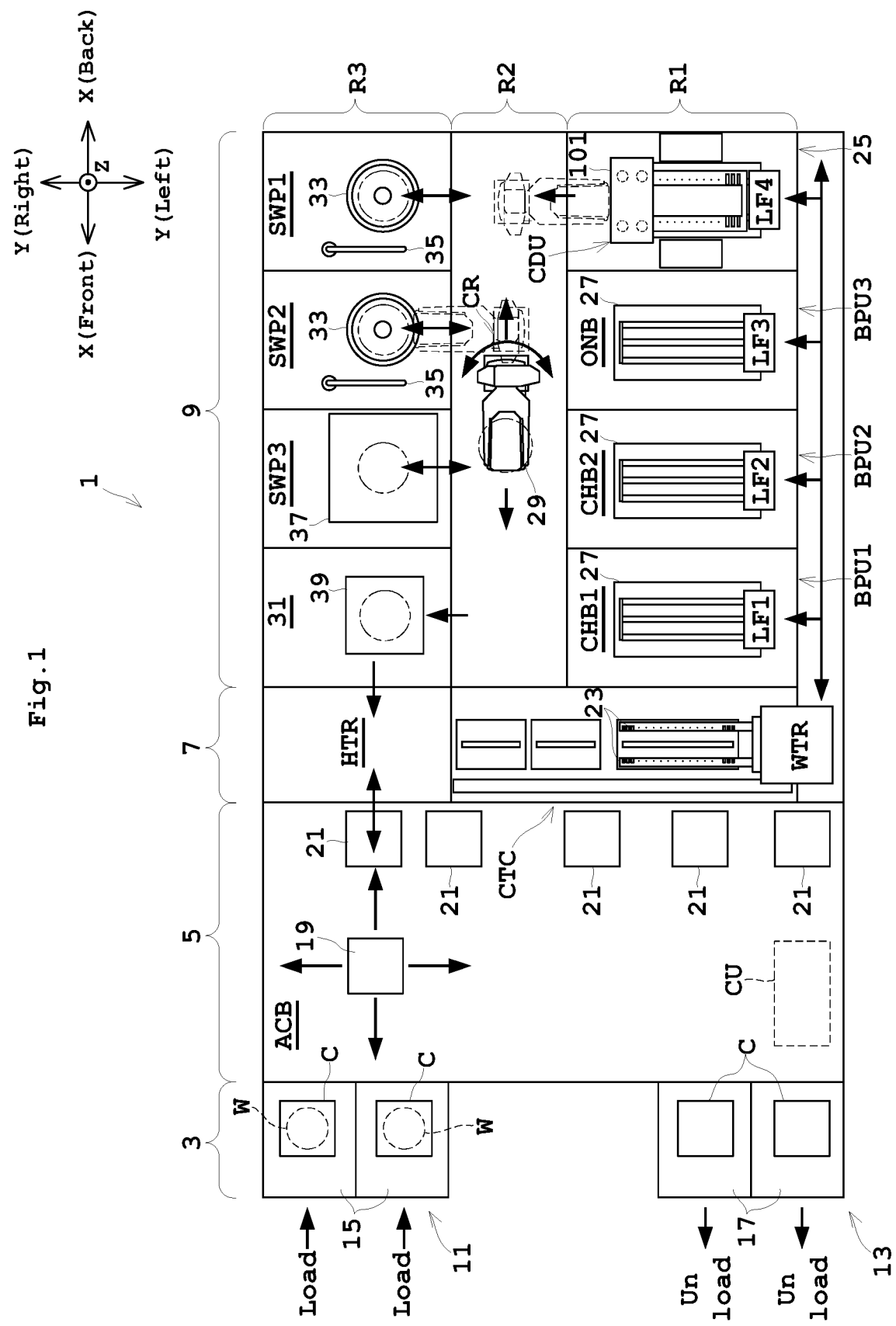
FIG. 1 is a plan view of a substrate treating apparatus according to one embodiment.

FIG. 1 is a plan view of a substrate treating apparatus according to one embodiment.

1. Overall Configuration

A substrate treating apparatus 1 includes a loading and unloading block 3, a stocker block 5, a transferring block 7, and a treating block 9.

The substrate treating apparatus 1 treats substrates W. The substrate treating apparatus 1 performs chemical liquid treatment, cleaning treatment, dry treatment, and the like, for example, on the substrates W. The substrate treating apparatus 1 adopts a process system that combines a batch type and a single-wafer type (so-called hybrid type). In the batch type, treatment is performed on a plurality of substrates W in a vertical posture collectively. In the single-wafer type, treatment is performed on one substrate W in a horizontal posture.

In the present specification, the direction in which the loading and unloading block 3, the stocker block 5, the transferring block 7, and the treating block 9 are arranged is referred to as a "front-back direction X" for convenience. The front-back direction X is horizontal. One direction of the front-back direction X from the stocker block 5 to the loading and unloading block 3 is referred to as "forward".

The direction opposite to the forward direction is referred to as "rearward". A horizontal direction orthogonal to the front-back direction X is referred to as a "transverse direction Y". Moreover, one direction of the transverse direction Y is referred to as "rightward", as appropriate. The direction opposite to the rightward direction is referred to as "leftward". The perpendicular direction relative to the horizontal direction is referred to as a "vertical direction Z". For reference, the drawings show front, rear, right, left, up, and down, as appropriate.

2. Loading and Unloading Block

The loading and unloading block 3 includes a loading unit 11 and an unloading unit 13. The loading unit 11 and the unloading unit 13 are arranged in the transverse direction Y. A plurality of (e.g., twenty-five) substrates W are accommodated within one carrier C in a stack manner at uniform pitches in a horizontal posture. The carrier C accommodating untreated substrates W is placed on the loading unit 11. The loading unit 11 includes two mount tables 15, for example, on which the carrier C is placed. The carrier C has a plurality of grooves (not shown) formed therein for separating faces of the substrates W individually and accommodating the substrates W, respectively. Examples of the carrier C include a front opening unify pod (FOUP). The FOUP is a sealing container. The carrier C may be an opened container, which type is not specified.

The unloading unit 13 is arranged opposite to the loading unit 11 across a center portion of the substrate treating apparatus 1 in the transverse direction Y. The unloading unit 13 is arranged leftward Y of the loading unit 11. The unloading unit 13 loads the treated substrates W into the carrier C, and unloads the carrier C containing the substrates W. Similar to the loading unit 11, the unloading unit 13 functioning as above includes two mount tables 17, for example, on which the carrier C is placed. The loading unit 11 and the unloading unit 13 are also referred to as a load port.

3. Stocker Block

The stocker block 5 ad joints the loading and unloading block 3 rearward X. The stocker block 5 includes a transporting and accommodating unit ACB. The transporting and accommodating unit ACB includes a transport mechanism 19 and shelves 21.

The transport mechanism 19 transports the carrier C. The transporting and accommodating unit ACB includes a plurality of shelves 21. There are two types of shelves 21, one of which the carrier C is simply placed on temporarily and the other of which the carrier C is placed on for delivery to and from a first transport mechanism HTR. The transporting and accommodating unit ACB takes the carrier C, in which untreated substrates W are housed, from the loading unit 11, and places the carrier C on the shelf 21. The transporting and accommodating unit ACB transports the carrier C to place the carrier C on a deliver shelf 21 in response to a schedule that defines an order of treatment. The transporting and accommodating unit ACB transports the carrier C from which the substrates W are placed on the deliver shelf 21 to place the empty carrier C the shelf 21. The transporting and accommodating unit ACB transports the carrier C, placed on the deliver shelf 21 and in which the treated substrates W are housed by the first transport mechanism HTR, to the shelf 21 to place the carrier C on the shelf 21. The transporting and accommodating unit ACB unloads the carrier C, placed on the shelf 21 and in which the treated substrates W are housed, to the unloading unit 13.

4. Transferring Block

The stocker block 7 adjoints rearward X of the transferring block 5. The transferring block 7 includes a first transport mechanism HTR, a transferring mechanism CTC, and a second transport mechanism WTR.

The transport mechanism HTR is arranged rightward Y and rearward X of the transporting and accommodating unit ACB. The first transport mechanism HTR transports substrates W collectively. In other words, the first transport mechanism HTR includes a plurality of hands (not shown). One of the hands supports one substrate W. The first transport mechanism HTR can transport only one substrate W. The first transport mechanism HTR takes a plurality of (e.g., twenty-five) from the carrier C, placed on the deliver shelf 21 in the transporting and accommodating unit ACB, and transports the substrates W to the transferring mechanism CTC. At this time, the first transport mechanism HTR turns a posture of the substrates W from a horizontal posture to a vertical posture. The first transport mechanism HTR receives the treated substrates W collectively from the treating block 9, which is to be mentioned later. The first transport mechanism HTR transports the treated substrates W collectively to the carrier C placed on the deliver shelf 21 in the transporting and accommodating unit ACB.

The first transferring mechanism CTC is arranged leftward Y of the first transport mechanism HTR. The transferring mechanism CTC delivers the substrates W between the first transport mechanism HTR and the second transport mechanism WTR. The transferring mechanism CTC transports the substrates W in the transverse direction Y between the first transport mechanism HTR and the second transport mechanism WTR. After receiving the substrates W from the first transport mechanism HTR, the transferring mechanism CTC moves to the second transport mechanism WTR in the transverse direction Y. At this time, the transferring, mechanism CTC performs batch lot assemble or batch lot release. For example, the transferring mechanism CTC combines the substrates W constituting one lot taken out from one carrier C with the substrates W constituting another lot taken out from another carrier C as one batch lot. This corresponds to batch lot assemble. Operation reverse to this corresponds to batch lot release. That is, the substrates W constituting one lot of one batch lot are separated from the substrates W constituting another lot of the same batch lot to be returned to their original lots. Typically, pitches of substrates W taken out of a carrier C are equal to pitches of carriers C. This is called full-pitch. In one batch lot, pitches of the substrates W are half the full pitch, for example. This is called half-pitch. Here, since the present invention does not concern the pitch, description of the pitch is to be omitted for easy understanding of the invention.

Now, the following description does not concern the construction of the lots to be processed. That is, there is no difference between the typical lot and the batch lot in the present invention, and thus a target to be processed is simply called a lot or a plurality of substrates W in the following description.

The second transport mechanism WTR is arranged leftward Y of the transferring mechanism CTC. The second transport mechanism WTR is configured to be movable between the transferring block 7 and the treating block 9. The second transport mechanism WTR is configured to be movable in the front-back direction X. The second transport mechanism WTR includes one-paired hands 23 configured to transport a lot. The one-paired hands 23 include rotary shafts, respectively, that extend in the transverse direction Y, for example. The one-paired hands 23 swing around the rotary shafts, respectively. The one-hands 23 grasp both edges of the substrates W constituting the lot. The second transport mechanism WTR delivers the substrates W to and from the transferring mechanism CTC. The second transport mechanism WTR delivers untreated substrates W to the treating block 9.

Here, the second transport mechanism WTR described above corresponds to the "first transport unit" in the present invention.

5. Treating Block

The treating block 9 performs treatment on the substrates W. Except for the second transport mechanism WTR, the treating block 9 is divided into a first line R1, a second line R2, and a third line R3 in the transverse direction Y. Specifically, the first line R1 is arranged leftward Y. The second line R2 is arranged in the middle in the transverse direction Y. In other words, the second line R2 is arranged rightward Y of the first line R1. The third line R3 is arranged rightward Y of the second line R2.

5-1. First Line

The first line R1 mainly includes a batch-type processing unit. Specifically, the first line R1 includes a first batch processing unit BPU1, a second batch processing unit BPU2, a third batch processing unit BPU3, an underwater posture turning unit 25, and a cleaning and drying unit CDU. The first batch processing unit BPU1 adjoints rearward X of the transferring block 7. The second batch processing unit BPU2 adjoints rearward X of the first batch processing unit BPU1. The third batch processing, unit BPU3 adjoints rearward X of the second batch processing unit BPU2. An underwater posture turning unit 25 adjoints rearward X of the third batch processing unit BPU3. The cleaning and drying unit CDU is located above the underwater posture turning unit 25. The cleaning and drying unit CUD is positioned near a second line R2 in the transverse direction Y.

Here, the first batch processing unit BPU1, the second batch processing unit BPU2, and the third batch processing unit BPU3 correspond to the "batch-type processing unit" in the present invention.

The first batch processing unit BPU1 is, for example, a chemical processing unit CHB1. The chemical processing unit CHB1 performs phosphoric acid treatment, for example. In the phosphoric acid treatment, phosphoric acid is used as a treatment liquid. In the phosphoric acid treatment, etching treatment is performed on a plurality of substrates W. In the etching treatment, a film thickness of a coating deposited on the substrate W is chemically ground, for example. The coating is, for example, nitride film.

The chemical processing unit CHB1 includes a process tank 27 and a lifter LF1. The process tank 27 stores a treatment liquid. The process tank 27 supplies the treatment liquid upward from the below, for example. The lifter LF1 moves upward and downward in the vertical direction Z. Specifically, the lifter LF1 moves upward and downward between a treating position inside of the process tank 27 and a delivery position above the process tank 27. The lifter LF1 holds a plurality of substrates W in a vertical posture. The lifter LF1 delivers the substrates W at the delivery position to and from the second transport mechanism WTR.

The second batch processing unit BPU2 is, for example, a chemical processing unit CHB2. The chemical processing unit CHB2 has a configuration similar to that of the chemical processing unit CHB1. That is, the chemical processing unit CHB2 includes another process tank 27 and a lifter LF2. The chemical processing unit CHB2 performs treatment similar to that performed by the chemical processing unit CHB1. That is, there is a plurality of processing units that perform the same chemical liquid treatment. This is because a longer period of time is needed for phosphoric acid treatment than other chemical liquid treatment and the deionized water cleaning treatment. For example, it takes around sixty minutes to perform the phosphoric acid treatment. Accordingly, the phosphoric acid treatment is performed in the processing units simultaneously, leading to enhanced throughput.

The third batch processing unit BPU3 is, for example, a deionized water processing unit ONB. The deionized water processing unit ONB has a configuration similar to those of the chemical processing units CHB1 and CHB2. That is, deionized water processing unit ONB includes another process tank 27 and a lifter LF3. However, the process tank 27 mainly receives deionized water for deionized water cleaning treatment. The process tank 27 of the deionized water processing unit ONB cleans the substrates W to which a chemical liquid is adhered. In other words, the process tank 27 of the deionized water processing unit ONB cleans off the chemical adhered to the substrates W. When specific resistance of the deionized water in the process tank 27 increases to a given value, for example, the deionized water processing unit ONB stops the cleaning treatment.

5-2. Second Line

The second line R2 includes a center robot CR. The center robot CR includes a hand 29. The hand 29 holds one substrate W. The center robot CR may adopt a configuration, for example, that includes another hand 29 in the vertical direction Z. The center robot CR is configured to be movable in the front-back direction X. The center robot CR is configured to be movable upward and downward in the vertical direction X. The center robot CR is configured in such a manner as to be turnable in a horizontal plane including the front-back direction X and the transverse direction Y. The hand 29 is configured in such a manner as to be able to advance and withdraw in a horizontal plane including the front-back direction X and the transverse direction Y. The hand 29 receives substrates W one by one from the underwater posture turning unit 25. The center robot CR delivers every one substrate W to the third line R3. The center robot CR delivers substrates W one by one to the third line R3. Now, when the center robot CR includes two hands 29, the hands 29 receives two substrates W from the underwater posture turning unit 25, and delivers the substrates W to two positions, respectively, to and from the third line R3.

The center robot CR described above corresponds to the "second transport unit" in the present invention.

5-3. Third Line

The third line R3 mainly includes a single-wafer-type processing unit. Specifically, the third line R3 includes a first single-wafer processing unit SWP1, a second single-wafer processing unit SWP2, a third single-wafer processing unit SWP3, and a buffer unit 31. The first single-wafer processing unit SWP1 is arranged at the innermost side in the front-hack direction X. In other words, the first single-wafer processing unit SWP1 is arranged opposite to the underwater posture turning unit 25 across the second line R2 in the transverse direction Y. The second single-wafer processing unit SWP2 adjoints forward X of the first single-wafer processing unit SWP1. The third single-wafer processing unit SWP3 adjoints forward X of the second single-wafer processing unit SWP2. The buffer unit 31 adjoints forward X of the third single-wafer processing unit SWP3 and rearward X of the first transport mechanism HTR.

Here, the first single-wafer processing unit SWP1, the second single-wafer processing unit SWP2, and the third single-wafer processing unit SWP3 correspond to the "single-wafer-type processing unit" in the present invention.

The first single-wafer processing unit SWP1 and the second single-wafer processing unit SWP2 each include, for example, a rotating unit 33 and a nozzle 35. This causes the rotating unit 33 to rotate the substrate W in a horizontal plane. The nozzle 35 supplies the treatment liquid and gas to the substrate W. The nozzle 35 does not supply the treatment liquid and gas at the same time. The nozzle 35 can supply only the treatment liquid or only gas. The nozzle 35 swings between a standby position apart from the treating portion 33 and a supply position above the rotating unit 33. The treatment liquid is, for example, isopropyl alcohol (IPA) or deionized water. The gas is, for example, nitrogen gas ($N_2$ gas). It is preferred that nitrogen gas is dried nitrogen gas. The first single-wafer processing unit SWP1 and the second single-wafer processing unit SWP2 each perform cleaning treatment on the substrate W with deionized water, and then perform preliminary dry treatment with IPA, for example.

Here, the rotating unit 33 described above corresponds to the "spin chuck" in the present invention. The nozzle 35 described above corresponds to the "treatment liquid supplying mechanism" and the "gas supplying mechanism" in the present invention.

The third single-wafer processing unit SWP3 includes, for example, a supercritical fluid chamber 37. The supercritical fluid chamber 37 performs dry treatment with supercritical fluid, for example. The fluid used at this time is, for example, carbon dioxide. The supercritical fluid chamber 37 performs treatment on the substrate W with the treatment liquid under a supercritical state. The supercritical state is obtained by bringing fluid into critical temperature and pressure inherent in the fluid. Specifically, when the fluid is carbon dioxide, a critical temperature is 31 degrees Celsius and critical pressure is 7.38 MPa. Under the supercritical state, the fluid has a surface tension of zero. Accordingly, patterns of the substrate W are not affected by a gas-liquid interface. Consequently, pattern collapse is unlikely to occur in the substrate W.

The buffer unit 31 includes, for example, a plurality of steps of mount shelves 39. The mount shelves 39 are preferably stacked in the vertical direction Z. At least one lot of substrates W call be placed in the mount shelves 39. Since the first transport mechanism HTR can take out the substrates W collectively, the first transport mechanism HTR has lower load than the case where the first transport mechanism HTR takes out the substrates W one by one. The buffer unit 31 is accessible from different horizontal directions. The center robot CR accesses the buffer unit 39 from a side adjacent to the second line R2 toward rightward Y to place the substrate W. The first transport mechanism HTR accesses the buffer unit 39 from frontward X to rearward X to receive one lot of the substrates W. The first transport mechanism HTR can also receive less than one lot of the substrates W. The center robot CR described above moves upward and downward among the mount shelves 39 in the vertical direction Z to deliver the substrates W.

It is preferable that, in the first single-wafer processing unit SWP1, the second single-wafer processing unit SWP2, and the third single-wafer processing unit SWP3, the processing units likewise are stacked in multiple steps in the vertical direction Z. This achieves enhanced throughput.

6. Control System

Figure 2:
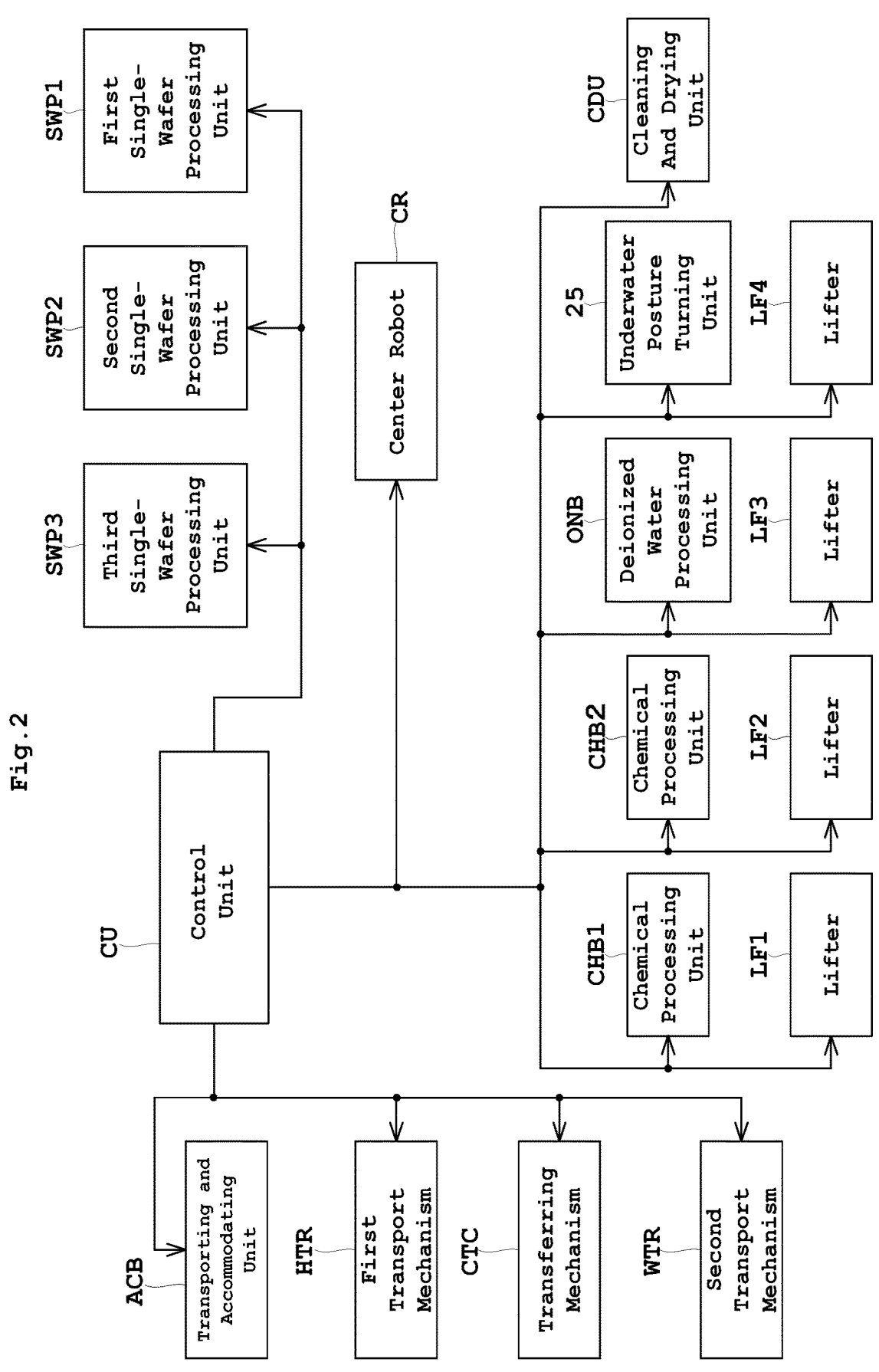
FIG. 2 is a block diagram of a control system.

Reference is now made to FIG. 2. FIG. 2 is a block diagram of a control system.

A control unit CU controls en bloc each element of the apparatus mentioned above. The control unit CU includes a CPU and a memory. The control unit CU is electrically connected to the elements described above via signal wires. The control unit CU operates each component in response to programs stored in advance in the memory to perform treatment on the substrates W.

7. Underwater Posture Turning Unit

Figure 3:
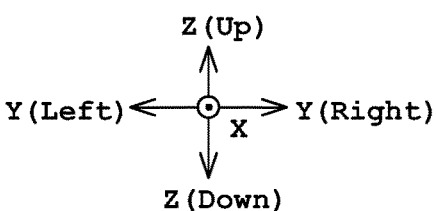
FIG. 3 is a side view of an underwater posture turning unit and a cleaning and drying unit.
Figure 4:
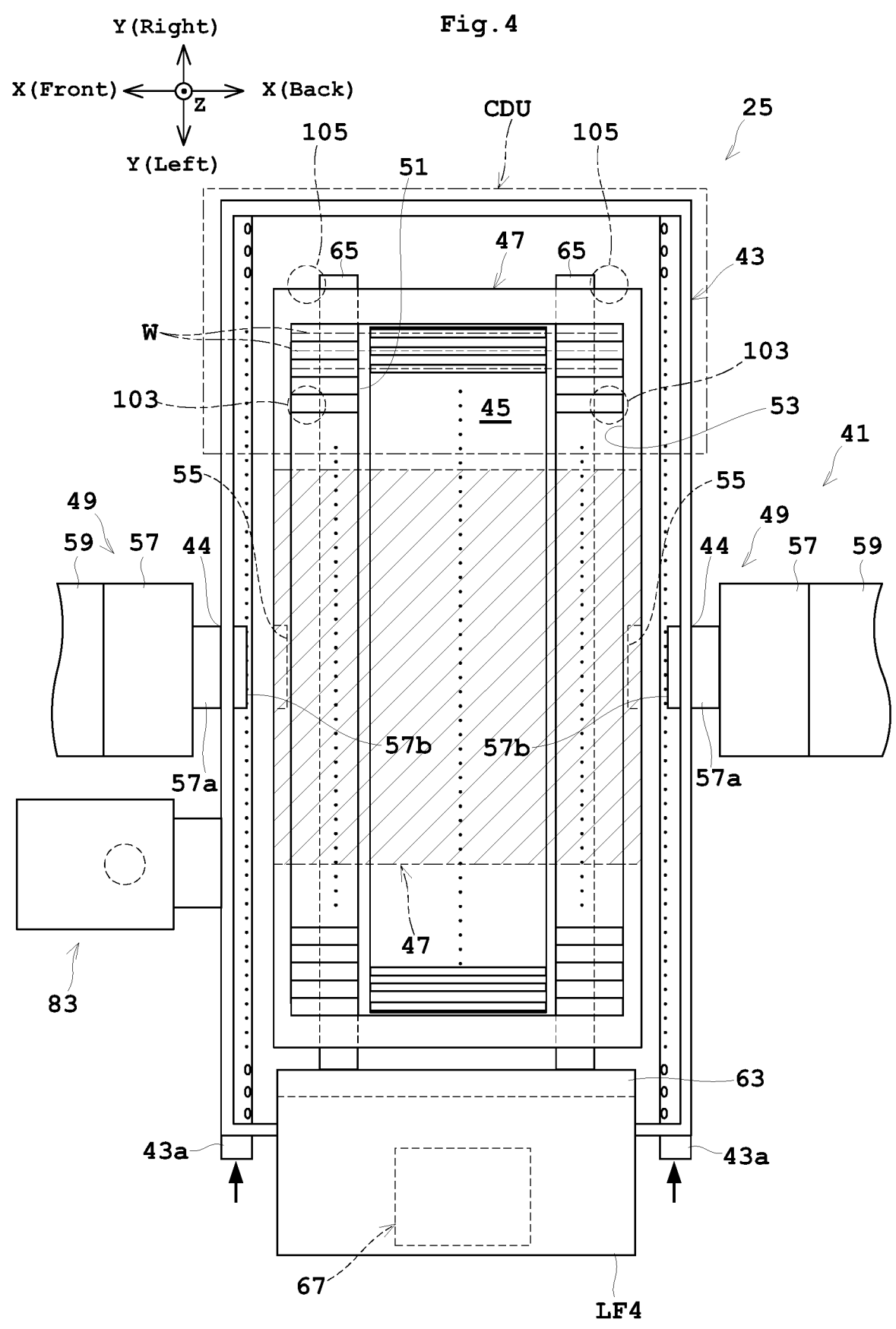
FIG. 4 is a plan view of the underwater posture turning unit.
Figure 5:
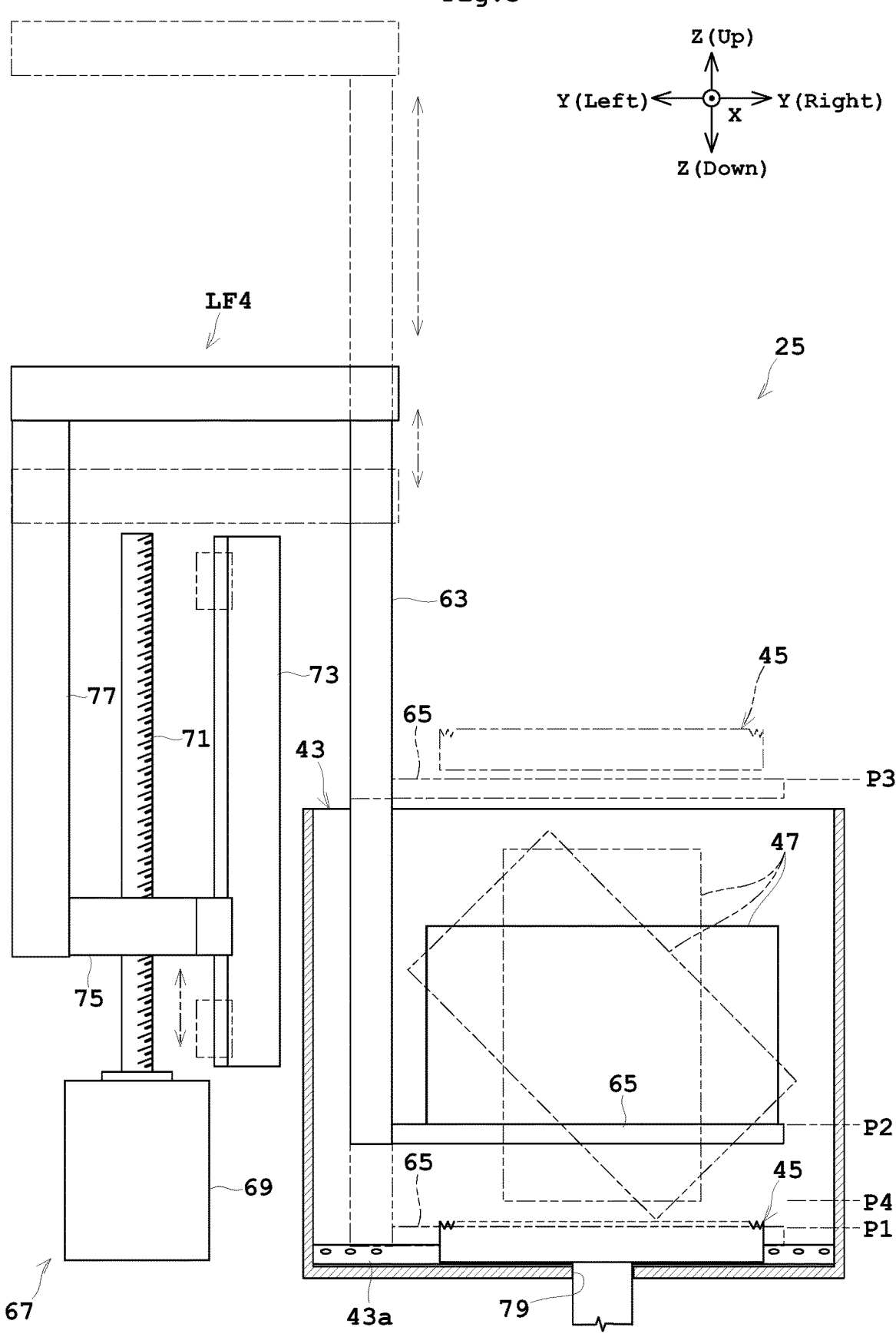
FIG. 5 is a side view of the underwater posture turning unit.
Figure 6:
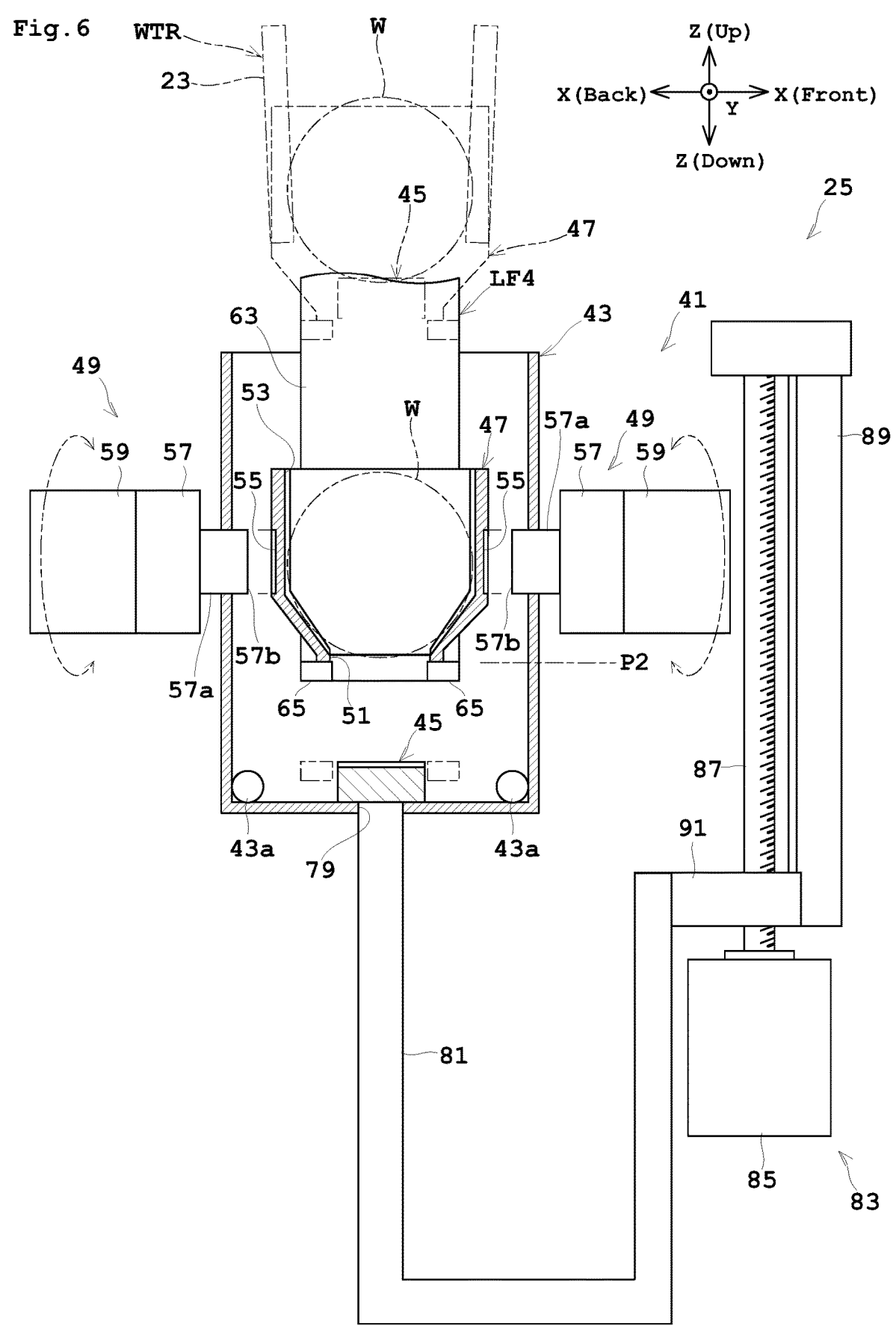
FIG. 6 is a front view of the underwater posture turning unit.

Now, description is made of the underwater posture turning unit with reference to FIGS. 3 to 6. FIG. 3 is a side view of the underwater posture turning unit and the cleaning and drying unit. FIG. 4 is a plan view of the underwater posture turning unit. FIG. 5 is a side view of the underwater posture turning unit. FIG. 6 is a front view of the underwater posture turning unit.

The underwater posture turning unit 25 includes a posture turning unit 41, an immersion tank 43, a lifter LF4 and a pusher 45. The posture turning unit 41 includes an in-tank carrier 4 and a rotating mechanism 49.

The in-tank carrier 47 in a horizontal state accommodates a plurality of substrates W in a vertical posture. The in-tank carrier 47 accommodates the substrates W at given intervals along a given alignment direction. The substrates faces a direction orthogonal to the alignment direction. Here in this embodiment, the alignment direction corresponds to the transverse direction Y. The in-tank carrier 47 has an opening 51 formed at the bottom thereof. The in-tank carrier 47 has an opening 53 formed at the top face thereof. The opening 53 has a length in the front-back direction X longer than a diameter of the substrate W. The opening 51 is smaller than the opening 53 in its opening area. The in-tank carrier 47 includes engaging portions 55. The engaging portions 55 are formed in two outer surfaces of the in-tank carrier 47 in the front-back direction X. The engaging portions 55 are formed in the outer surfaces orthogonal to the alignment direction of the substrates W.

The immersion tank 43 accommodates the in-tank carrier 47. The immersion tank 43 has a dimension in which the in-tank carrier 47 is sufficiently accommodated under the liquid level regardless of a condition whether the in-tank carrier 47 is in a vertical state (substrates W are in a horizontal posture) or a horizontal state (substrates W are in a vertical posture). The immersion tank 43 includes jet pipes 43a at both sides of the bottom face thereof in the front-back direction X. The jet pipes 43a each have a tubular shape. The jet pipes 43a each have a long shaft in the transverse direction Y. The jet pipes 43a are each long in the transverse direction Y. The jet pipes 43a each supply deionized water to a center part of the immersion tank 43 in the front-back direction X. The jet pipes 43a each form an upward flow of the deionized water flowing upward from the bottom of the immersion tank 43. The deionized water supplied into the immersion tank 43 from the jet pipes 43 is discharged over an upper edge of the immersion tank 43.

The rotating mechanism 49 includes an air cylinder 57 and a motor 59. The air cylinder 57 includes an operating shaft 57a and an engaging piece 57b. The operating shaft 57a advances and withdraws in the front-back direction X in response to on-off of the air cylinder 57. The immersion tank 43 has through holes 44 formed therein. The through holes 44 are formed in the side walls of the immersion tank 43 in the front-back direction X. The operating shaft 57 is attached to the through hole 44 of the immersion tank 43 in a liquid-tight manner. The operating shaft 57a can advance and withdraw in the front-back direction in the liquid-tight manner. The operating shaft 57a can rotate around an axis in the front-back direction X in the liquid-tight manner. In other words, the operating shaft 57a can advance and withdraw and can also rotate relative to the center part of the immersion tank 43 in a maintained liquid-tight manner.

An advancing position of the engaging piece 57b of the operating shaft 57a for engaging the engaging portion 55 is a connecting position. A retracted position of the engaging piece 57b of the operating shaft 57a for spacing apart from the engaging portion is an opened position. The operating shaft 57a shown in FIG. 4 is located while the engaging piece 57b thereof is in the opened position.

The engaging piece 57b engages the engaging portion 55 of the in-tank carrier 47. The engaging piece 57b has a shape (contour) of a circumferential face so as to engage the engaging portion 55. The engaging portion 55 and the engaging piece 57b each have a polygon shape seen from the front-back direction X, for example. The engaging piece 57b is slightly smaller than the engaging portion 55 in dimension in the cross-sectional shape. An inner peripheral surface shape of the engaging portion 55 is similar to an outer circumferential surface of the engaging piece 57b. The in-tank carrier 47 is integrated with the operating shaft 57a while the engaging piece 57b engages the engaging portion 55. In other words, the in-tank carrier 47 does not rotate around the axis in the front-back direction X with respect to the operating shaft 57a while the engaging piece 57b engages the engaging portion 55. The in-tank carrier 47 is rotatable together with the operating shaft 57a around the axis in the front-back direction X.

When the air cylinder 57 turns on, the operating shaft 57a advances, for example. When the air cylinder 57 turns off, the operating shaft 57a withdraws, for example. When the air cylinder 57 turns on, the air cylinder 57 moves to the connecting position where the engaging piece 57b engages the engaging portion 55. When the air cylinder 57 turns off, the air cylinder 57 moves to the opened position where the engaging piece 57b spaces away from the engaging portion 55. In the connecting position, the operating shaft 57a is integrated with the in-tank carrier 47. In the opened position, the operating shaft 57a is separated from the in-tank carrier 47.

The motor 59 rotates the air cylinder 57 around the axis in the front-back direction X. When the air cylinder 57 turns on and the motor 59 rotates in a first direction, the motor 59 causes the in-tank carrier 47 to rotate around the axis in the front-back direction X. When the air cylinder 57 turns on and the motor 59 rotates in a second direction reverse to the first direction, the motor 59 causes the in carrier 47 to rotate reversely around the axis in the front-back direction X. Rotation angles at this time are each around 90 degrees. The rotation angles at this time correspond to rotation angles where a posture of the substrates W accommodated in the in-tank carrier 47 turns to a horizontal posture and a vertical posture.

The lifter LF4 includes a back plate 63 and a supporting portion 65. The back plate 63 extends along an inner surface of the immersion tank 43. The back plate 63 extends at a lower part in the vertical direction Z of the inner surface in the front-back direction X. For example, two supporting portions 65 are attached to a lower end of the back plate 63. The two supporting portions 65 extend in the transverse direction Y. The two supporting portions 65 have a gap in the front-back direction X larger than the opening 51. The two supporting portions 65 have a gap in the front-back direction X smaller than a width of the in-tank carrier 47 in the front-back direction X. The lifter LF4 supports the in tank carrier 47 such that a longitudinal direction of the in-tank carrier 47 is made horizontal.

A lifting mechanism 67 is located near the lifter LF4. The lifting mechanism 67 includes a motor 69, a threaded shaft 71, a linear guide 73, and a lifting piece 75. The motor 69 is located in a posture where the rotary shaft faces in a longitudinal direction. The threaded shaft 71 is attached to the rotary shaft of the motor 69. The threaded shaft 71 faces in the vertical direction Z. The linear guide 73 is provided parallel to the threaded shaft 71. The linear guide 73 faces in the vertical direction Z. The lifting piece 75 is screwed on the threaded shaft 71. One end of the lifting piece 75 is slidably attached to the linear guide 73. The other of the lifting piece 75 is attached to a connecting member 77. The connecting member 77 has an inverted L-shape. The connecting member 77 is coupled to an upper end of the back plate 63.

When the motor 69 is actuated, the threaded shaft 71 is rotated. When the threaded shaft 71 is rotated, the lifting piece 75 is moved upward and downward in the vertical direction Z along the linear guide 73 in response to a rotation direction of the motor 69. This causes the tiller LF4 to move upward and downward to a plurality of height positions.

For example, as shown in FIG. 5, the lifting mechanism 67 causes the lifter LF4 to move upward and downward among a first height position P1, a second height position P2, a third height position P3, and a fourth height position P4. The first height position P1 is lower than the second to fourth height positions P2 to P4. The second height position P2 is higher than the first height position P1 and the fourth height position P4, and lower than the third height position P3. The third height position P3 is higher than the first height position P1, the second height position P2, and the fourth height position P4. The fourth height position P4 is higher than the first height position P1 and lower than the second height position P2 and the third height position P3.

At the first height position P1 the supporting portion 65 of the lifter LF4 is positioned near the bottom face of the immersion tank 43. The first height position P1 is a position where the in-tank carrier 47 is grasped by the rotating mechanism 49 and the supporting portion 65 is spaced apart from the lower face of the in-tank carrier 47. The first height position P1 is a position where the in-tank carrier 47 is rotated vertically the longitudinal direction by the rotating mechanism 49 within the immersion tank 43.

The second height position P2 is a position where the in-tank carrier 47 is entirely supported under a liquid level of the immersion tank 43. At the second height position P2, the opening 53 of the in-tank carrier 47 is positioned below the liquid level. The second height position P2 is a position where the rotating mechanism 49 grasps the in-tank carrier 47. At the second height position P2, the engaging portion 55 of the in-tank carrier 47 and the engaging piece 57*b* of the air cylinder 57 are aligned linearly in the horizontal direction. In other words, the second height position P2 is a position where the engaging portion 55 faces the engaging piece 57*b* in the horizontal direction.

The third height position P3 is a position where a plurality of substrates W are delivered between the second transport mechanism WTR and the in-tank carrier 47. At the third height position P3, the supporting portion 65 of the lifter LF4 is positioned above the liquid level of the immersion tank 43, for example. However, the supporting portion 65 is not necessarily positioned above the liquid level since the bottom of the in-tank carrier 47 may be positioned above the liquid level.

At the fourth height position P4, the in-tank carrier 47 in which the substrates W are in a horizontal posture is kept under the liquid level of the immersion tank 43. In other words, the fourth height position P4 makes the in-tank carrier 47 in the vertical state kept under the liquid level. A stepwise position from the fourth height position P4 to the third height position P3 corresponds to a height position where only substrates W to be transported by the center robot CR are located above the liquid level of the immersion tank 43.

The immersion tank 43 has through hole 79 formed in the bottom thereof. A lifting member 81 is inserted into the through hole 79. The lifting member 81 is inserted into the through hole 79 while the immersion tank 43 is kept in a liquid-tight manner. The lifting member 81 has a U-shape. A pusher 45 is at to one end of the lifting member 81. The pusher 45 can support the substrates W collectively. The pusher 45 contacts and supports lower edges of the substrates W. As shown in FIGS. 4 and 6, the pusher 45 has a dimension smaller than the openings 51 and 53 of the in tank carrier 47. The pusher 45 can pass through the in-tank carrier 47 in the vertical direction Z to move upward and downward. The pusher 45 is narrower than the gap between supporting portions 65 of the lifter LF4 in the front-back direction X. The pusher 45 does not interfere with the in-tank carrier 47 and the supporting portion 65 of the lifter LF4.

As shown in FIGS. 4 and 6, the pusher 45 includes a lifting mechanism 83 at a position near thereto. The lifting mechanism 83 includes a motor 85, a threaded shaft 87, a linear guide 89, and a lifting piece 91. The rotary shaft of the motor 85 is located in a longitudinal direction. The threaded shaft 87 is attached to the rotary shaft of the motor 85. The threaded shaft 87 is arranged in the vertical direction Z. The linear guide 89 is arranged in a positional relationship parallel to the threaded shalt 87. The linear guide 89 is arranged in the vertical direction Z. The lifting piece 91 is screwed on the threaded shaft 87. One end of the lifting piece 87 is slidably attached to the linear guide 89. The other of the lifting piece 87 is connected to the lifting member 81.

When the motor 85 is driven forward or reverse, the threaded shalt 87 rotates in a forward direction or a reverse direction. The lifting piece 91 is moved upward and downward along, the linear guide 89 in the vertical direction Z in response to a rotation direction of the motor 85. This causes the pusher 45 to move upward and downward in the vertical direction Z. The pusher 45 is moved upward and downward between the standby position and the transferring position. The standby position is a lower part of the in-tank carrier 47 and in the vicinity of the bottom of the immersion tank 43. This standby position is shown in FIGS. 5 and 6 by solid lines. The transferring position is above the liquid level of the immersion tank 43. This transferring position is shown in FIGS. 5 and 6 by chain double-dashed line. The transferring position is a position where a plurality of substrates W are delivered to and from the second transport mechanism WTR.

Here, since the in-tank carrier 47 is turned by the rotating mechanism 49, defacement in the in-tank carrier 47 may be recovered by replacing the in-tank carrier 47 only. This can shorten downtime in the substrate treating apparatus 1, leading to expected enhancement of availability.

8. Cleaning and Drying Unit

The following describes the cleaning and drying unit CDU with reference to FIGS. 3 and 4.

The cleaning and drying unit CDU includes a support frame 101, a cleaning liquid nozzle 103, and a gas nozzle 105.

The support frame 101 is located above the underwater posture turning unit 25 by struts not shown. As shown in FIG. 3, the support frame is positioned at a level slightly higher than a top face of the in-tank carrier 47 at the uppermost position. Accordingly, the hand 29 can be cleaned and dried even when the in-tank carrier 47 is moved to the uppermost position. In other words, the hand 29 can be cleaned and dried regardless of the height position of the in-tank carrier 47.

The support frame 101 includes a ceiling portion 101*a* and side faces 101*b*. The support frame 101 is located immediately above the immersion tank 43. The support frame 101 is positioned near the second line R2 of the immersion tank 43 in the transverse direction Y. As illustrated in FIG. 3, the support frame 101 is positioned so as not to overlap the in-tank carrier 47 in the vertical state in plan view. FIG. 4 illustrates the in-tank carrier 47 in the elongated state by hatching. The support frame 101 includes the side faces 101*b* at both ends thereof in the front-back direction X. The side faces 101*b* are each provided so as to suspend downward from the ceiling portion 101*a*. In other words, the support frame 101 has a square bracket shape when seen from the transverse direction Y. The support frame 101 includes no bottom face.

The support frame 101 have the cleaning liquid nozzle 103 and the gas nozzle 105 attached thereto. Specifically, the support frame 101 have the cleaning liquid nozzle 103 and the gas nozzle 105 attached to the ceiling portion 101*a* thereof. In other words, the cleaning liquid nozzle 103 and the gas nozzle 105 are attached to a lower face of the ceiling portion 101*a*.

The cleaning liquid nozzle 103 is attached to a portion of the support frame 101 leftward Y in the transverse direction Y. In other words, the cleaning liquid nozzle 103 is attached to a portion of the support frame 101 adjacent to the lifter LF4 in the transverse direction Y. The cleaning liquid nozzle 103 is formed by two pieces, for example. The two cleaning liquid nozzles 103 are separated from each other in the front-back direction X. The cleaning liquid nozzles 103 are the same in configuration. The cleaning liquid nozzles 103 each eject the cleaning liquid downward. The cleaning liquid nozzles 103 are each located at a position where the cleaning liquid can be supplied to the hand 29 of the center robot CR. The cleaning liquid is, for example, deionized water or an organic solvent. The organic solvent is, for example, isopropyl alcohol (IPA).

The gas nozzle 105 is formed of two pieces, for example. The two gas nozzles 105 are located at a position closer to the second line R2 than the cleaning liquid nozzle 103 in the transverse direction Y. In other words, the two gas nozzles 105 are located at a position closer to the center robot CR than the two cleaning liquid nozzles 103. The two gas nozzles 105 are separated from each other in the front-back direction X. The gas nozzles 105 are the same in configuration. The gas nozzles 105 each eject gas downward. The gas nozzles 105 are each located at a position where gas can be supplied to the hand 29 of the center robot CR. The gas is, for example, nitrogen gas ($N_2$ gas). It is preferred that nitrogen gas is dried nitrogen gas. The gas may be other than nitrogen gas as long as it is an inert gas.

The number of the cleaning liquid nozzles 103 and the number of the gas nozzles 105 are not limited to two as long as the hand 29 can be cleaned and dried. The number may each be one. The number may each be three or more.

The cleaning and drying unit CDU is configured as described above. Accordingly, an interior of the cleaning and drying unit CDU and an interior of the underwater posture turning unit 25 are in fluid communication with each other in the vertical direction Z. In other words, there is no partition that divides the interior of the cleaning and drying unit CDU and the interior of the underwater posture turning unit 25 in the vertical direction Z.

As shown in FIG. 3, the hand 29 of the center robot CR described above advances and withdraws relative to the cleaning and drying unit CDU in the transverse direction Y. Specifically, the center robot CR causes the hand 29 to advance and withdraw between a first horizontal position HP1 and a second horizontal position HP2. These positions correspond to positions of distal ends of the hand 29. The first horizontal position HP1 is a position near the underwater posture turning unit 25 and the cleaning and drying unit CDU in the transverse direction Y. The second horizontal position HP2 is a position near the opening 51 of the in-tank carrier 47 in the vertical state in the transverse direction Y. In other words, the second horizontal position HP2 is a position leftward Y than the first horizontal position HP1 in the transverse direction Y.

The center robot CR causes a level of the hand 29 in the vertical direction Z to move upward and downward between a first height position VP1 and a second height position VP2. The first height position VP1 corresponds to an enter level where the substrates W are taken out of the in-tank carrier 47. After the hand 29 enters at the first height position VP1, the hand 29 moves slightly upward in the vertical direction Z to pick up the substrate W, place the substrate W, and withdraw. The second height position VP2 is an enter level where the cleaning and drying unit CDU performs cleaning and drying treatment on the hand 29. The second height position VP2 is also an exit level where the hand 29 withdraws from the cleaning and drying unit CDU. However, the hand 29 may move upward slightly in the vertical direction Z at the same time as receiving of the substrate W when the hand 29 exits at the cleaning and drying treatment. This can simplify control on upward and downward movement of the hand 29 by the center robot CR.

Description will be given in detail of operations of the cleaning and drying unit CDU configured in such a manner as described above. Here, the gas nozzle 105 described above corresponds to the "drying mechanism" in the present invention.

9. Operation Explanation

The following describes operation of the underwater posture turning unit 25 in the substrate treating apparatus 1 described above with reference to FIGS. 7 to 14. FIGS. 7 to 14 are each an operational view of the underwater posture turning unit.

9-1. Batch Treatment

It is assumed that a plurality of substrates W are subjected to an etching treatment with phosphoric acid in the chemical treating unit CHB1, and then subjected to a deionized water cleaning treatment in the deionized water cleaning treatment ONB. The substrates W on which the deionized water cleaning treatment is performed are transported to the underwater posture turning unit 25 by the second transport mechanism WTR.

9-1. Posture Turning

Figure 7:
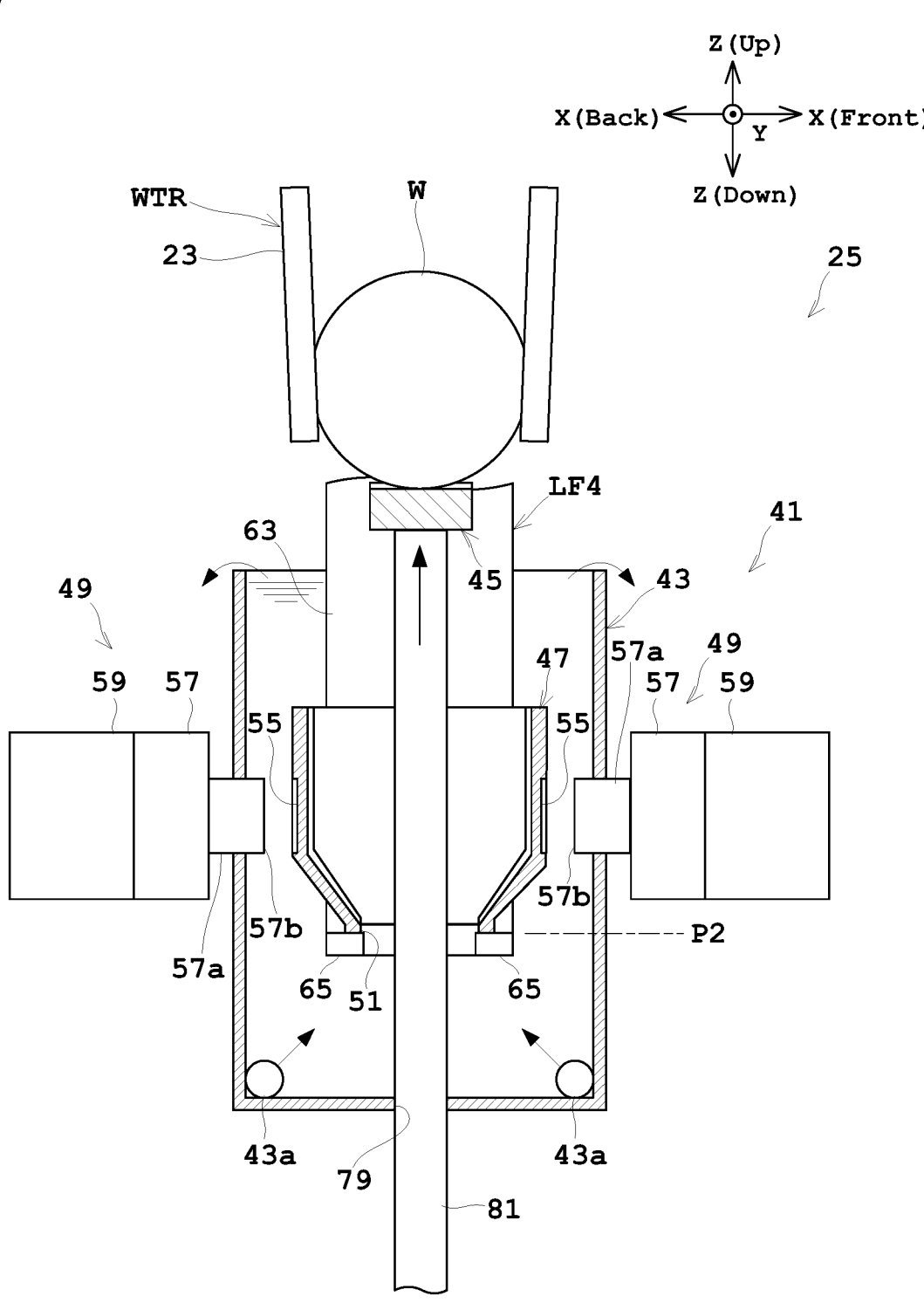
FIG. 7 is an operational view of the underwater posture turning unit.

Reference is made to FIG. 7. The second transport mechanism WTR grasps the substrates W, on which the deionized water cleaning treatment is performed in the deionized water processing unit ONB, with the hand 23, and are transported to the above of the underwater posture turning unit 25. At this time, in the underwater posture turning unit 25, the supporting portion 65 of the lifter LF4 is positioned at the second height position P2. The in-tank carrier 47 is supported by the supporting portions 65. The jet pipe 43a supplies deionized water into the immersion tank 43 in up flow. The deionized water flows out of the upper edge of the immersion tank 43. Accordingly, the immersion tank 43 is constantly filled with clean deionized water. In the rotating mechanism 49, the operating shaft 57a and the engaging piece 57b are in the opened position. That is, the rotating mechanism 49 is spaced apart from the in-tank carrier 47. The pusher 45 is moved upward from the standby position to the transferring position in the immersion tank 43. Accordingly, the pusher 45 contacts and supports lower edges of the substrates W held by the second transport mechanism WTR.

Figure 8:
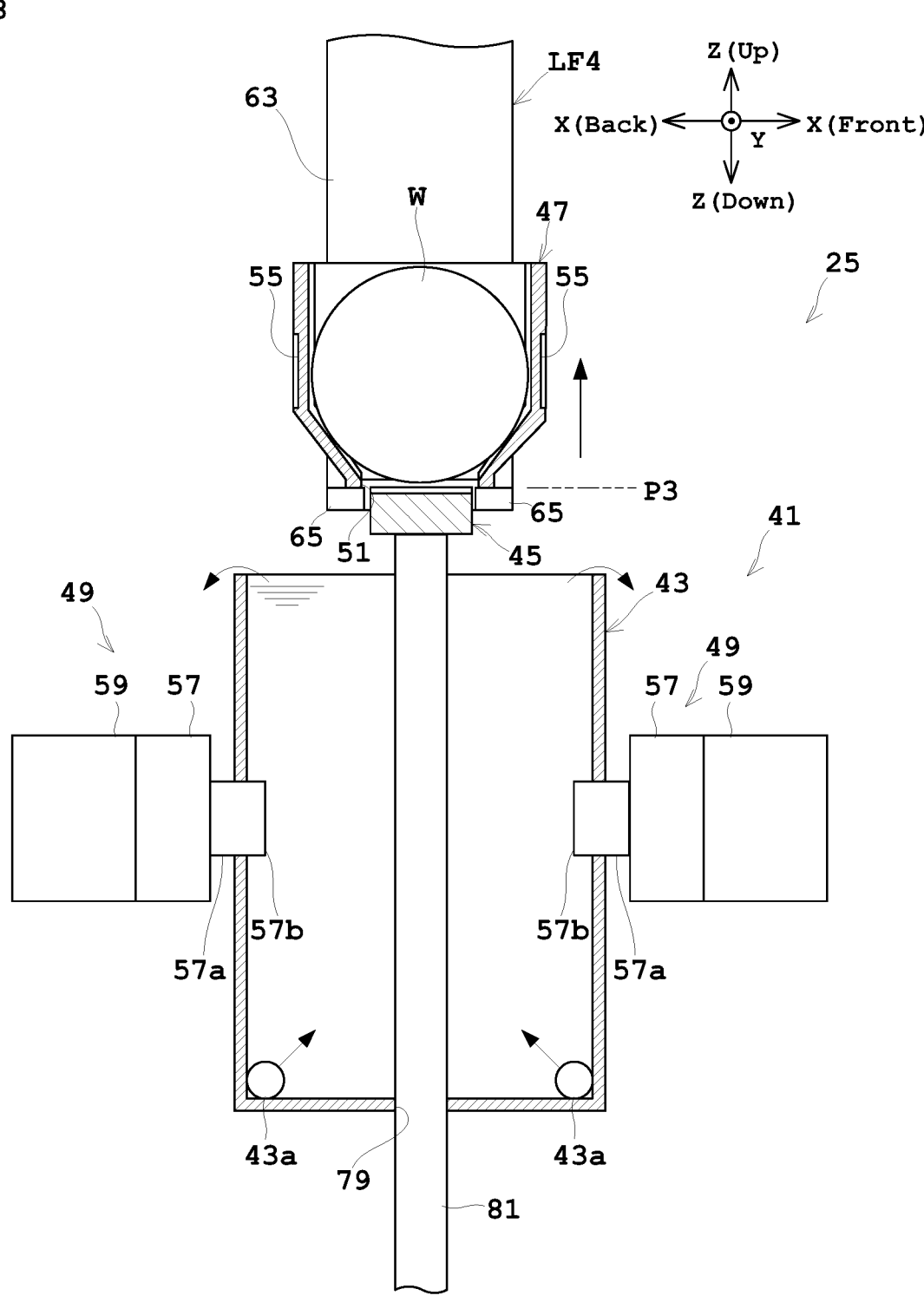
FIG. 8 is an operational view of the underwater posture turning unit.

Reference is made to FIG. 8. The second transport mechanism WTR releases grasp of the hand 23 to the substrates W, and releases the substrates W. Accordingly, the substrates W are delivered from the second transport mechanism WTR to the pusher 45. Then, the second transport mechanism WTR retreats from the above of the underwater posture turning unit 25. Specifically, the second transport mechanism WTRT moves to the first batch processing unit BPU1.

The lifting mechanism 67 drives the motor 69 to move the lifter LF4 upward to the delivery position. Specifically, the lifter LF4 is moved to the third height position P3. Accordingly, the substrates W whose lower edges are supported by the pusher 45 are accommodated in the in-tank carrier 47.

Figure 9:
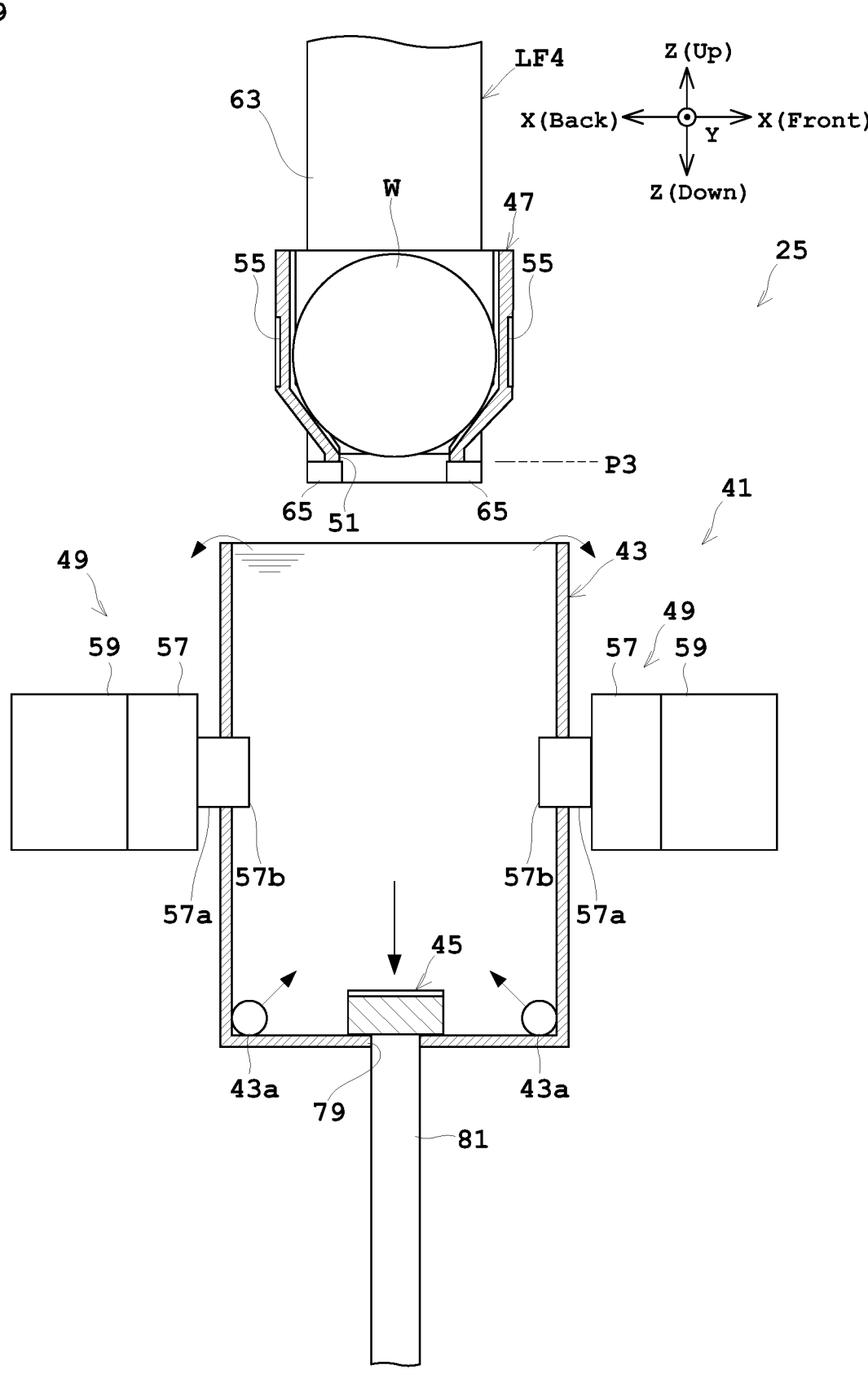
FIG. 9 is an operational view of the underwater posture turning unit.

Reference is made to FIG. 9. The lifting mechanism 83 drives the motor 85 to move the pusher 45 downward to the standby position. According, the substrates W are completely accommodated in the in-tank carrier 47.

Figure 10:
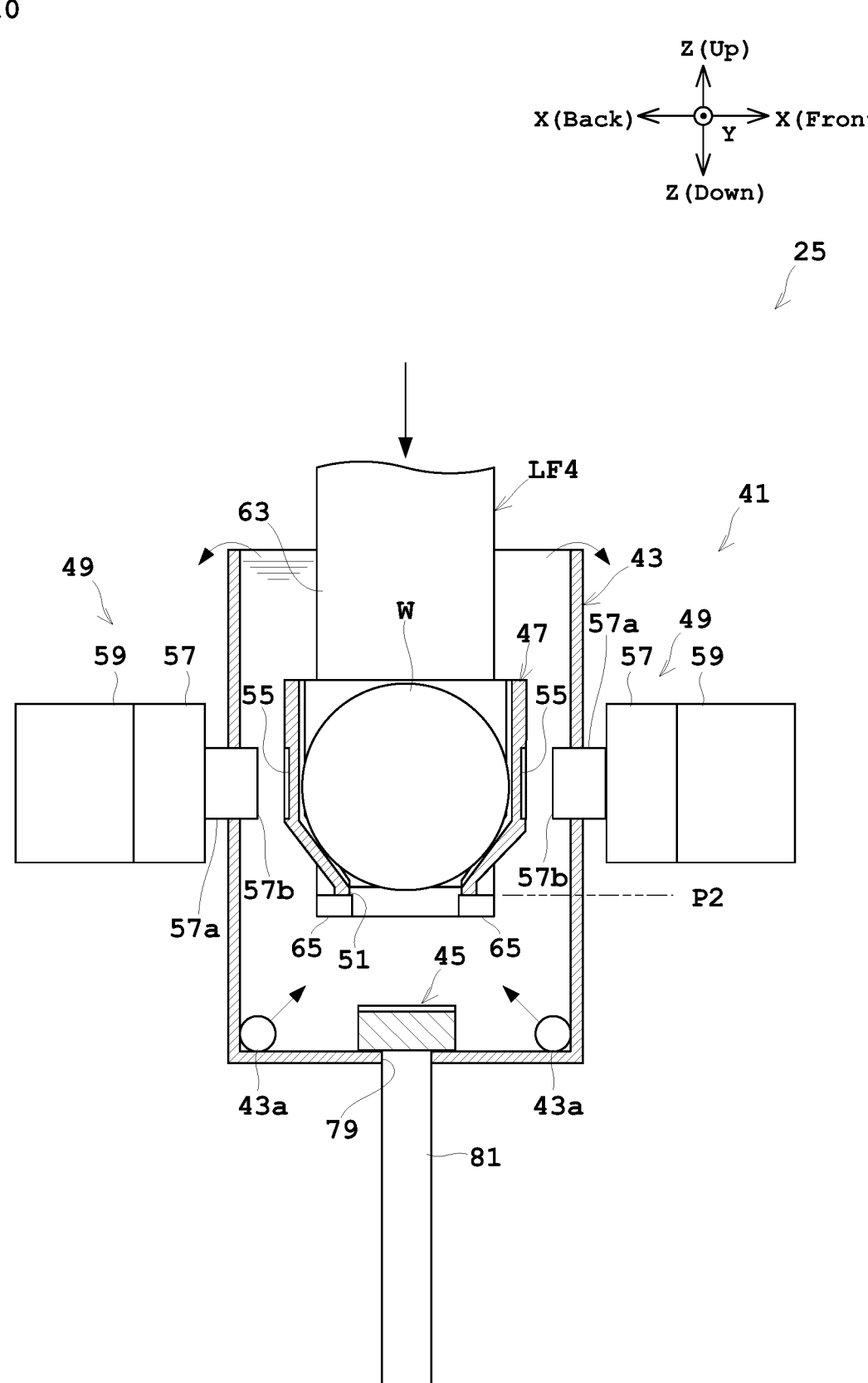
FIG. 10 is an operational view of the underwater posture turning unit.

Reference is made to FIG. 10. The lifting mechanism 67 drives the motor 69 to move the lifter LF4 downward to the second height position P2.

Figure 11:
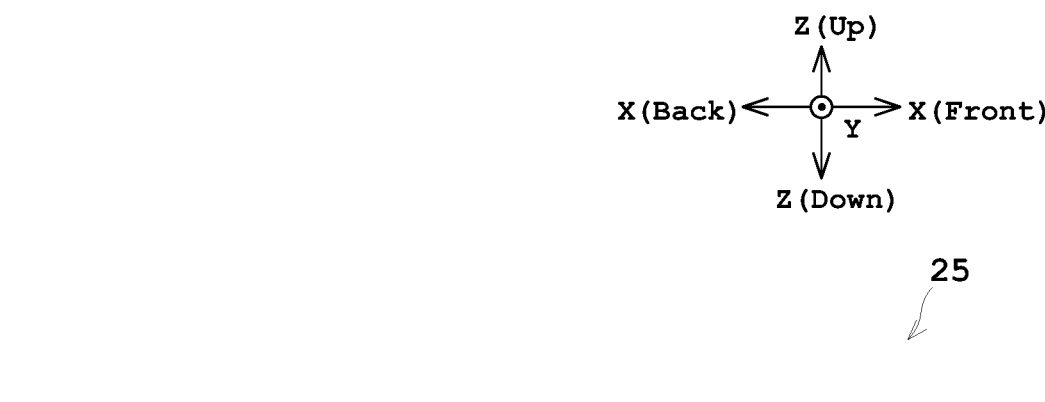
FIG. 11 is an operational view of the underwater posture turning unit.

Reference is made to FIG. 11. The rotating mechanism 49 actuates the air cylinder 57 to move out the operating shaft 57a into the in-tank carrier 47. The rotating mechanism 49 causes the operating shaft 57a to move out to the connecting position. Accordingly, the engaging piece 57b of the air cylinder 57 engages the air cylinder 55 of the in-tank carrier 47. The in-tank carrier 47 is grasped by the pained operating shafts 57a while the lower part thereof is supported by the lifter LF4. Then, the motor 69 of the lifting mechanism 67 rotates to move the lifter LF4 to the first height position P1. Accordingly, the in-tank carrier 47 is made grasped by only the paired operating shafts 57a.

Figure 12:
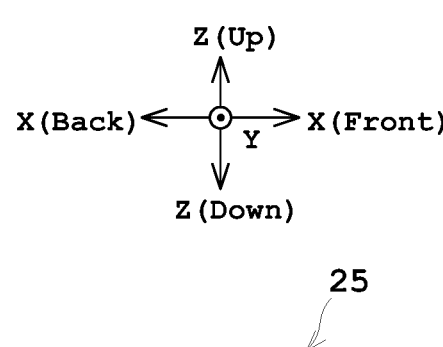
FIG. 12 is an operational view of the underwater posture turning unit.
Figure 12:
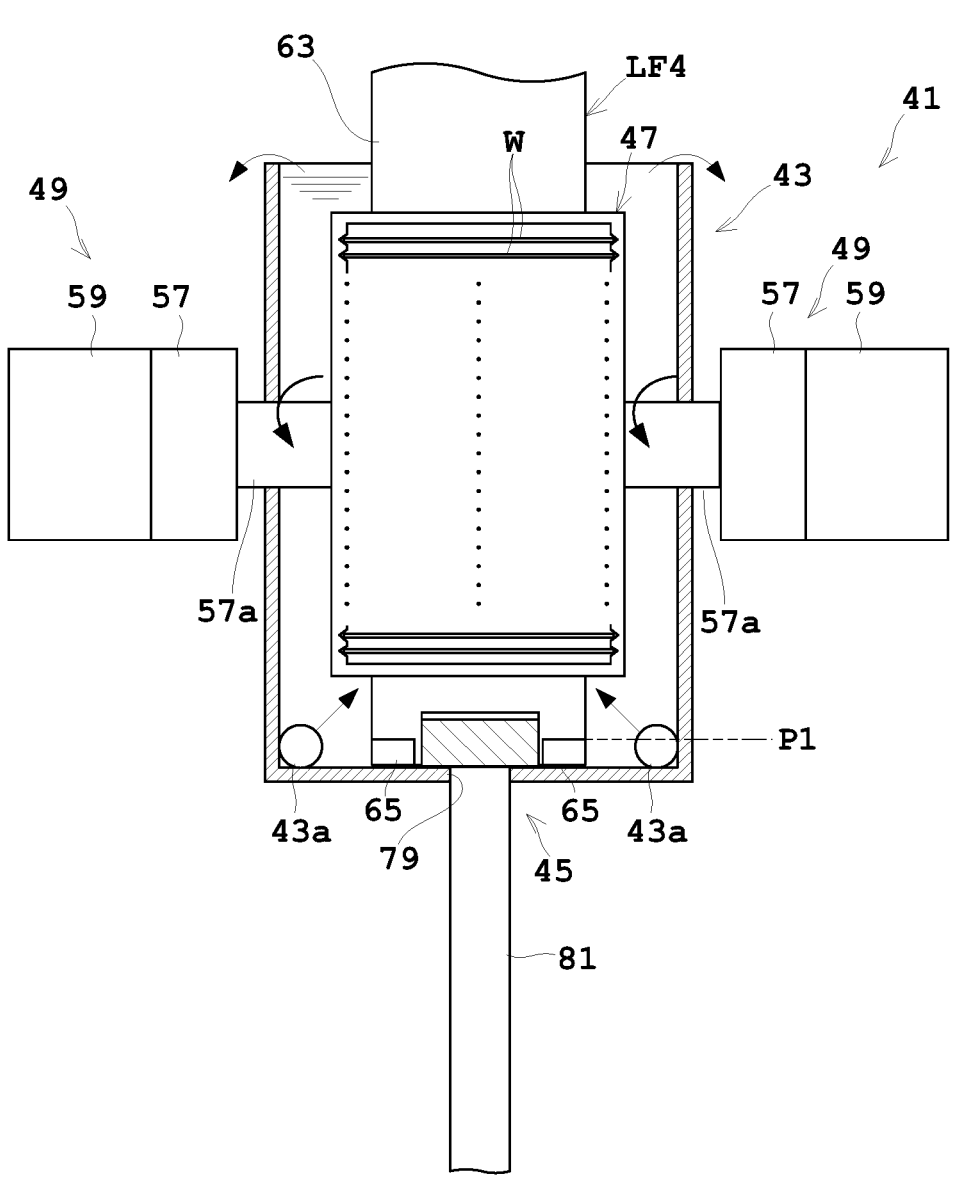

Reference is made to FIG. 12. The rotating mechanism 49 of the posture turning unit 41 is actuated. Specifically, the motor 59 of the rotating mechanism 49 is rotated to turn the in-tank carrier 47 together with the air cylinder 57 around an axis in the front-back direction X. In other words, the motor 59 is rotated to turn the cleaning in-tank carrier 47 counterclockwise seen from the deionized water processing unit ONB. A rotation angles is 90 degrees. Accordingly, the in-tank carrier 47 turns from a lateral (horizontal) posture to a longitudinal (vertical) posture. As a result, the posture of the substrates W turns from the vertical posture to the horizontal posture. At this time, the substrates W are kept immersed in the deionized water in the immersion tank 43. No part of the substrates W are exposed from the deionized water when the posture thereof turns.

As described above, the paired operating shaft 57a at the connecting position are turned by the rotating mechanism 49, whereby the in-tank carrier 47 can be turned to turn the posture of the substrates W to the horizontal posture collectively. Accordingly, the posture of the substrates W can be turned with a simple configuration, leading to suppressed apparatus costs.

Figure 13:
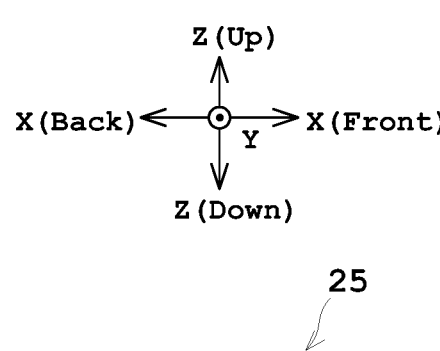
FIG. 13 is an operational view of the underwater posture turning unit.
Figure 13:
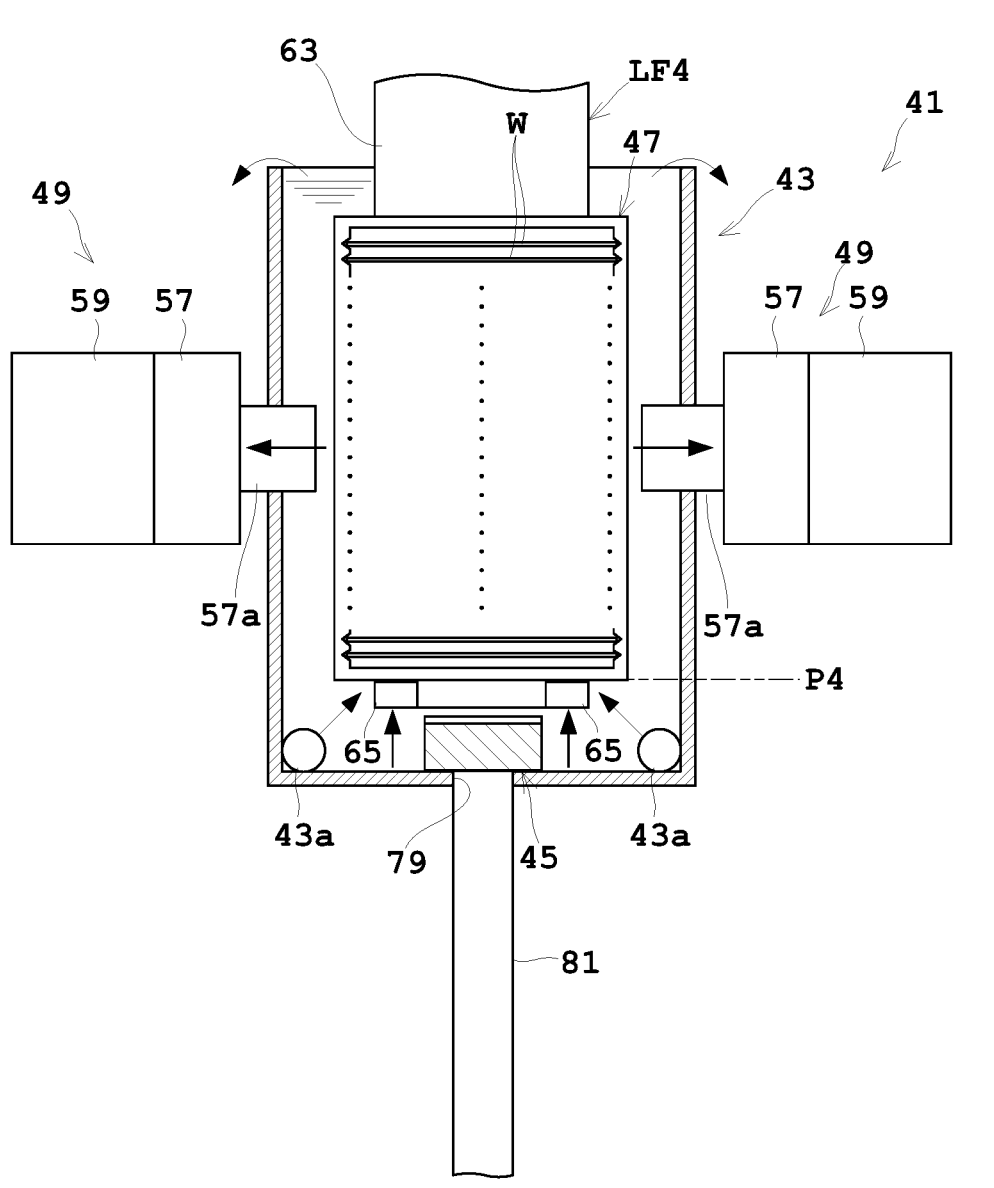

Reference is made to FIG. 13. The lifting mechanism 67 causes the litter LF4 to move to the fourth height position P4. Accordingly, the holder 65 of the lifter LF4 holds the in-tank carrier 47 in the vertical posture in the liquid. Moreover, the air cylinder 57 shrinks to move the operating shafts 57a to the opened position. Accordingly, the in-tank carrier 47 is held only with the lifter LF4.

Figure 14:
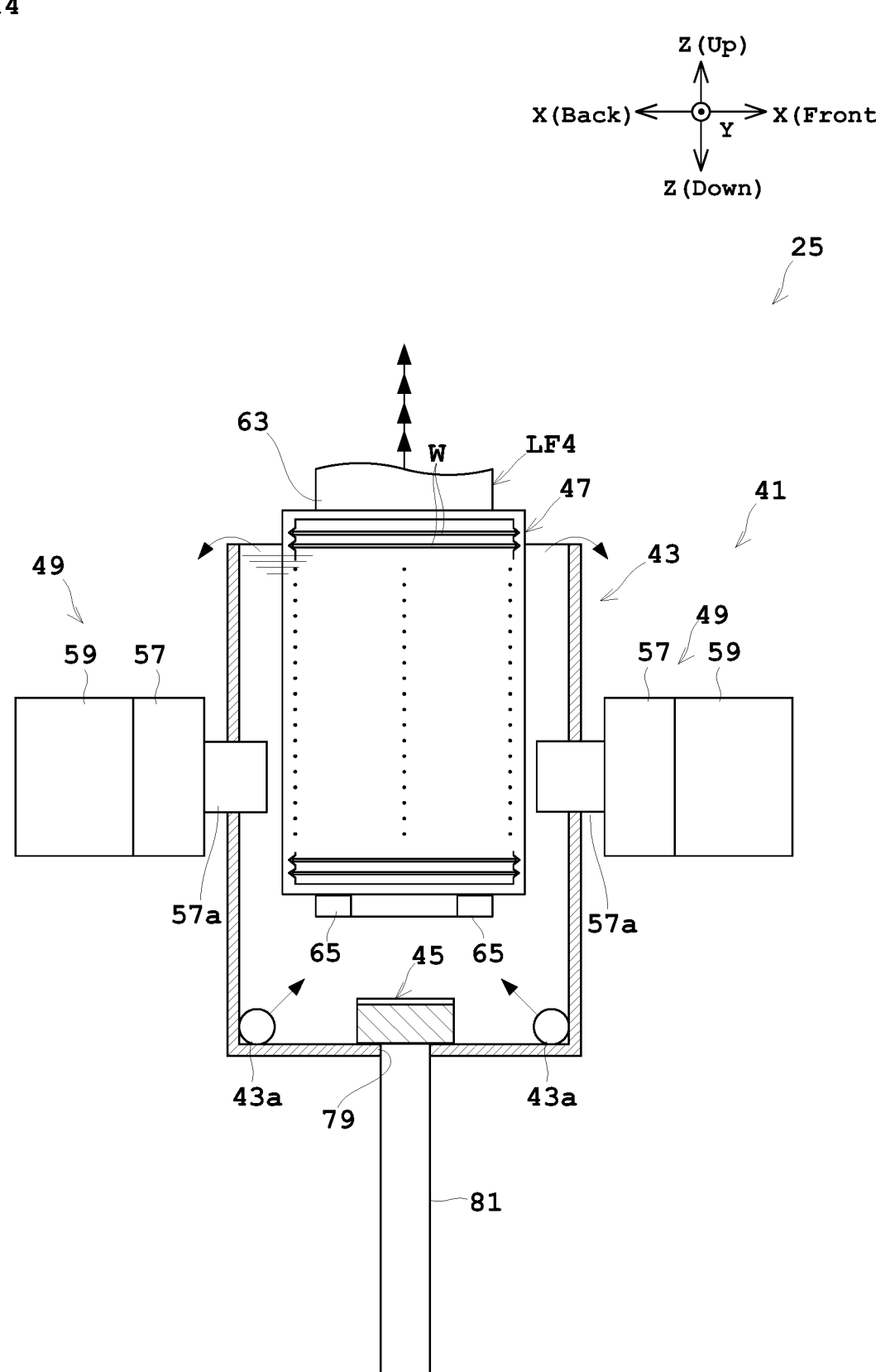
FIG. 14 is an operational view of the underwater posture turning unit.

Reference is made to FIG. 14. The lifting mechanism 67 causes the lifter LF4 to move upward from the fourth height position P4 to a position where only an uppermost substrate W in the in-tank carrier 47 is exposed from the liquid level. The substrate W is to be transported by the center robot CR. Accordingly, the uppermost substrate W is exposed above the liquid level of the immersion tank 43 while the deionized water stored in the immersion tank 43 covers an upper part thereof. In such a condition, the center robot CR advances the hand 29 into the in-tank carrier 47 to unload the uppermost substrate W.

When the center robot CR moves to the underwater posture turning unit 25 for transporting a next substrate W, the lifting mechanism 67 moves the lifter LF4 further upward. Specifically, the lifter LF4 is moved upward by a gap between grooves of the in-tank carrier 47. Accordingly, only the nest substrate W is exposed above the liquid level of the immersion tank 43. In such a condition, the center robot CR unloads the substrate W. As described above, the lifting mechanism 67 moves the lifter LF4 upward gradually each time the center robot CR comes to move. Accordingly, all the substrates W are transported by the center robot CR while they are wet with the deionized water.

As described above, substrates not to be transported by the center robot CR are positioned below the liquid level of the immersion tank 43. Accordingly, the substrates can be prevented from being dried until the substrates W are to be transported by the center robot CR. This results in suppressed pattern collapse of the substrates W.

9-3. Single-Wafer Treatment

The substrates W transported by the center robot CR in such a manner as described above are treated as under, for example.

The center robot CR transports the substrates W to the first single-wafer processing unit SWP1. The first single-wafer processing unit SWP1 supplies deionized water from the nozzle 35 while the rotating unit 33 rotates the substrates W. Then, the nozzle 35 supplies IPA to the substrates W and the deionized water adhered to the substrates W are replace by the IPA. Then, the center robot CR unloads the substrates W to the third single-wafer processing unit SWP3. In the third single-wafer processing unit SWP3, the substrates W are loaded into the supercritical fluid chamber 37. In the supercritical fluid chamber 37, dry treatment is performed on the substrates W with carbon dioxide. By the dry treatment in the supercritical fluid chamber 37, finishing dry treatment is performed on the substrates W. This completely dries the substrates W while suppressing collapse of the patterns formed on the substrates W.

The substrates W subjected to the dry treatment in the supercritical fluid chamber 37 are transported to the buffer unit 31 by the center robot CR. The center robot CR places the substrates W on the mount shelf 39 of the buffer unit 31. When one lot of substrates W are placed in the buffer unit 31, the first transport mechanism HTR transports the substrates W to the transport accommodating unit ACB at one time. The transport accommodating unit ACB transports every carrier C to the unloading unit 13. The single-wafer treatment and the transportation thereafter described above are performed on all the substrates W in the in-tank carrier 47. This allows performance of the batch treatment and the single-wafer treatment on all of the substrates W.

9-4. Cleaning and Drying Treatment of Hand 29

As described above, the substrates W are subjected to the dry treatment in the supercritical fluid chamber 37, and thereafter are finally transported to and placed on the buffer unit 31 by the center robot CR. The hand 29 of the center robot CR gets wet with deionized water when receiving the substrates W in the underwater posture turning unit 25. When the substrates W are transported by the wet hands 29 after the dry treatment in the supercritical fluid chamber 37, the substrates W subjected to the dry treatment get wet. In other words, the wet hand 29 may possibly contaminate the substrates W. Then, cleaning and drying treatment is performed on the hand 29 in the following manner before the substrates W are transported from the supercritical fluid chamber 37.

Here, the time before the substrates W are transported from the supercritical fluid chamber 37 contains time immediately before the substrates W are transported from the supercritical fluid chamber 37. Moreover, the time before the substrates W are transported from the supercritical fluid chamber 37 contains time after the substrates W are received from the underwater posture turning unit 25 and transported to the first single-wafer processing unit SWP1 or the second single-wafer processing unit SWP2.

Reference is now made to FIGS. 15 to 18. FIGS. 15 to 18 are each an operational view of the cleaning and drying unit. It is assumed that the hand 29 of the center robot CR is moved upward to the second height position VP2.

Figure 15:
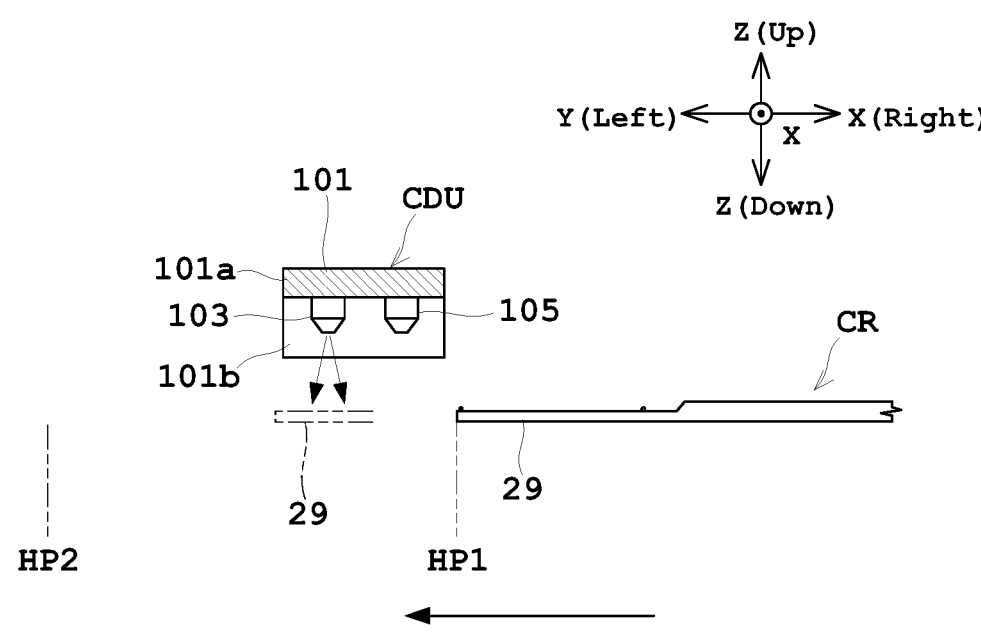
FIG. 15 is an operational view of the cleaning and drying unit.

As shown in FIG. 15, the hand 29 of the center robot CR is located at the first horizontal position HP1. The cleaning liquid nozzle 103 of the cleaning and drying unit CDU ejects deionized water. From this condition, the hand 29 of the center robot CR is moved leftward Y in the transverse direction Y. A moving speed at this time is preferably lower than an operation speed at which the substrates W in the in-tank carrier 47 are received. This is because an enhanced cleaning effect by deionized water is expected.

Figure 16:
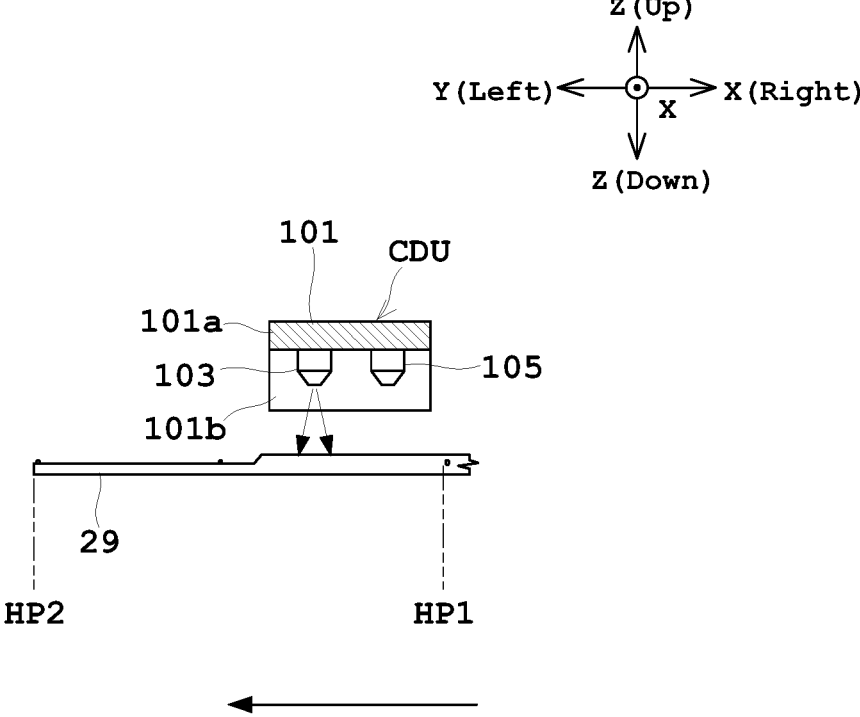
FIG. 16 is an operational view of the cleaning and drying unit.

As shown in FIG. 16, the hand 29 is moved to reach the second horizontal position HP2. The hand 29 temporarily stops at the second horizontal position HP2. At this time, a distal end side of the hand 29 is entirely cleaned with deionized water ejected from the cleaning liquid nozzle 103. Accordingly, particles or deionized water that may adhere to the substrates W received from the in-tank carrier 47 can be cleaned off with deionized water. The deionized water containing the particles and flowing downward over the hand 29 flow downward into the immersion tank 43. Since the deionized water flows out of the upper edge of the immersion tank 43, the substrates W within the immersion tank 43 are not adversely affected.

Figure 17:
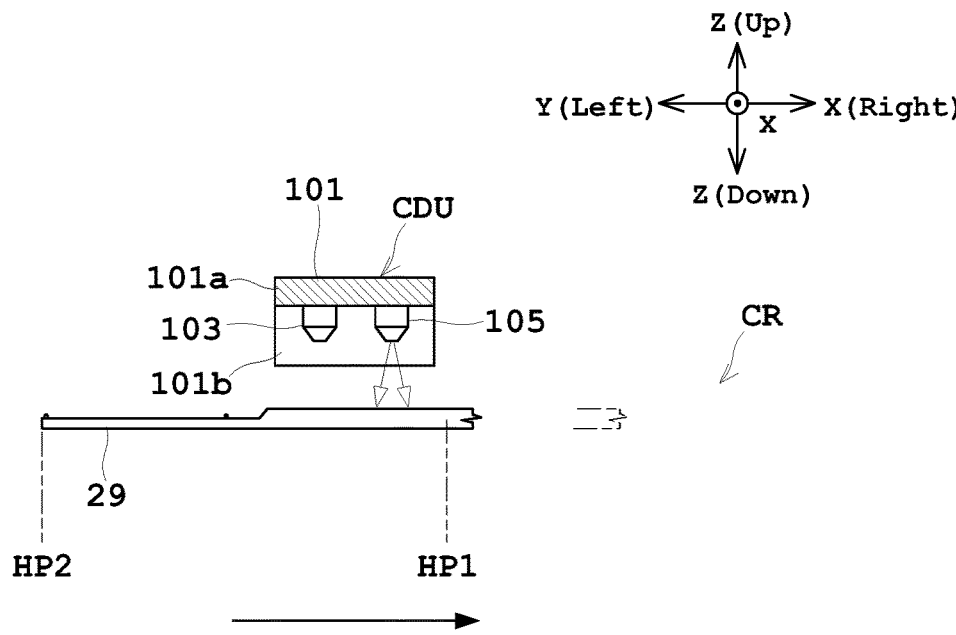
FIG. 17 is an operational view of the cleaning and drying unit.

After the hand 29 reaches the second horizontal position HP2, the cleaning liquid nozzle 103 stops ejecting deionized water. Moreover, as shown in FIG. 17, the gas nozzle 105 ejects nitrogen gas. Then, the hand 29 is moved from the second horizontal position HP2 to the first horizontal position HP1. Specifically, the hand 29 is moved rightward Y in the transverse direction Y. Also, a moving speed at this time is preferably lower than an operation speed at which the substrates W in the in-tank carrier 47 are received. This is because an enhanced drying effect by nitrogen gas is expected.

Figure 18:
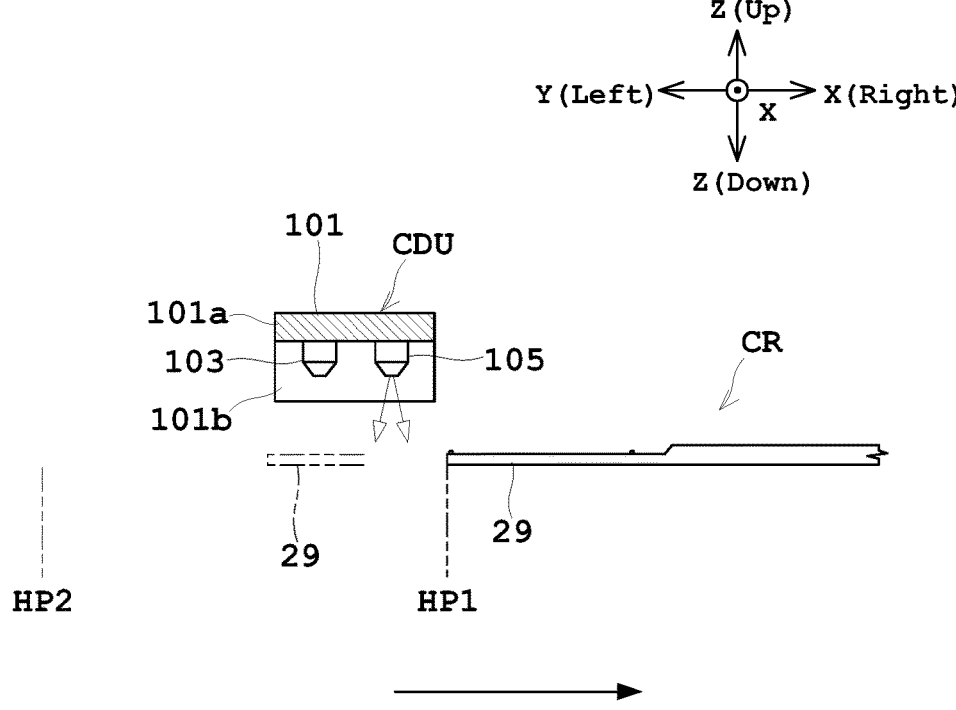
FIG. 18 is an operational view of the cleaning and drying unit.

As shown in FIG. 18, the hand 29 is moved to reach the first horizontal position HP1. Accordingly, deionized water adhered to the hand 29 is removed by the nitrogen gas from the gas nozzle 105. In other words, the hand 29 is drained by the nitrogen gas. The deionized water removed from the hand 29 flows downward. This can clean the hand 29 of the center robot CR.

According to the embodiment, the cleaning and drying unit CDU performs the cleaning and drying treatment on the hand 29 before the substrates W are transported from the supercritical fluid chamber 37. This can clean the hand 29 of the center robot CR. Accordingly, the center robot CR can prevent contamination during transportation of the dried substrates W from the supercritical fluid chamber 37 even though the wet substrates W are transported from the underwater posture turning unit 25. Consequently, contamination in transportation of dried substrates W can be prevented even though the substrates W are transported with the wet hand 29.

Here in the embodiment described above, a timing where the cleaning and drying treatment is performed on the hand 29 is before the substrates W are transported from the supercritical fluid chamber 37. This does not mean cleaning and drying of the hand 29 every time the hand 29 gets wet when the substrates W are transported from the underwater posture turning unit 25 to the second single-wafer processing unit SWP2 or the third single-wafer processing unit SWP3. Accordingly, cleaning and drying frequency of the hand 29 can be reduced. This results in a saved usage amount of deionized water and nitrogen gas needed for cleaning and drying.

With the cleaning and drying treatment described above, the deionized water removed from the hand 29 of the center robot CR flows downward. Below the hand 29, the immersion tank 43 storing deionized water is located. Accordingly, there is no need to arrange a vat for the cleaning and drying unit CDU. This simplifies the configuration of the apparatus, leading to suppressed costs. Moreover, the cleaning and drying unit CDU is located above the underwater posture turning unit 25. As a result, reduction in footprint of the substrate treating apparatus 1 is obtainable.

The present invention is not limited to the foregoing examples, but may be modified as follows.

(1) In the embodiment described above, the cleaning and drying treatment is performed on the hand 29 before the substrates W are transported from the supercritical fluid chamber 37. However, the present invention is not limitative to the cleaning and drying treatment at such a timing as above. For example, the cleaning and drying treatment may be performed on the hand 29 after a substrate W is transported from the underwater posture turning unit 25 to the first single-wafer processing unit SWP1 or the second single-wafer processing unit SWP2 and before another substrate W is transported.

In other words, the cleaning and drying treatment is performed on the hand 29 every time the hand 29 gets wet when the substrates W are transported from the underwater posture turning unit 25 to the first single-wafer processing unit SWP1 or the second single-wafer processing unit SWP2. That is, the cleaning and drying treatment is performed as soon the hand 29 gets wet as possible. Accordingly, a period of time from when the hand 29 gets wet to when the hand is cleaned and dried can be shortened. This can prevent residues on the hand 29, the residues being caused by adhered deionized water for a long period of time elapsed from when the hand 29 gets wet. As a result, cleanness of the hand 29 can be enhanced.

(2) In the embodiment described above, the cleaning and drying unit CDU is arranged above the underwater posture turning unit 25. However, the present invention is not limited to this construction. That is, the cleaning and drying unit CDU may be positioned so as not to overlap with the first batch processing unit BPU1 or the underwater posture turning unit 25 in plan view.

Figure 19:
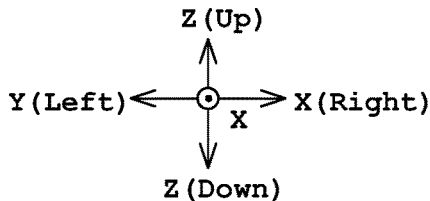
FIG. 19 is a side view of a drying mechanism according to one modification.
Figure 19:
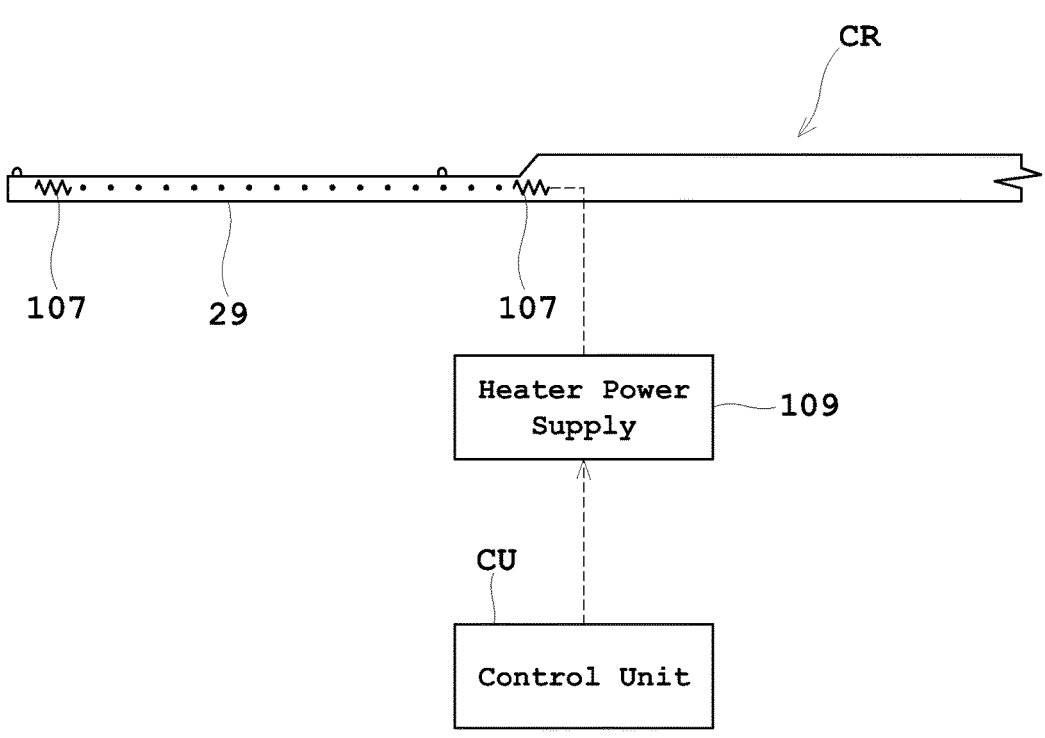

(3) In the embodiment described above, the gas nozzle 105 is described as one example of the drying mechanism. However, the present invention is not limited to this construction. For example, the drying mechanism as shown in FIG. 19 may be adopted. FIG. 19 is a side view of a drying mechanism according to one modification.

The hand 29 includes a heater 107 inside thereof as a drying mechanism. The heater 107 is electrically connected to a heater power supply 109. A heater power supply 109 is operated by the control unit CU. Power applied to the heater 107 from the heater power supply 109 is controlled by the control unit CU. Instead of the gas nozzle 105 described above, the cleaned hand 29 may be dried by heating the heater 107 via the heater power supply 109. Accordingly, the hand 29 can be dried while being moved to a position different from the cleaning and drying unit CDU after the hand 29 is cleaned by the cleaning liquid nozzle 103. Here, the gas nozzle 105 described above and the heater 107 may be used together.

In the case of the configuration described above, the hand 29 is preferably configured as under, for example. For example, the heater 107 is arranged on a top face of a stainless steel plate, and then the stainless steel plate and the heater 107 are coated with fluororesin. Alternatively, the heater 107 is arranged on a top face of a ceramic member, and then the ceramic member and the heater 107 are coated with fluororesin. This can easily build the heater 107 in the hand 29 without lowering chemical resistance of the hand 29.

(4) In the embodiment described above, the cleaning and drying unit CDU performs the cleaning and drying treatment on the hand 29. However, the cleaning and drying unit CDU may be omitted, and the first single-wafer processing unit SWP1 or the second single-wafer processing unit SWP2 may perform the cleaning and drying treatment. In this case, the hand 29 is moved to the first single-wafer processing unit SWP1 or the second single-wafer processing unit SWP2, and thereafter, the nozzle 35 supplies the treatment liquid as the cleaning liquid. Then, the nozzle 35 supplies nitrogen gas to perform the dry treatment. such is adoptable. Accordingly, the first single-wafer processing unit SWP1 or the second single-wafer processing unit SWP2 can also serve as the cleaning and drying unit CDU. This simplifies the configuration of the apparatus, leading to suppressed apparatus costs.

(5) In the embodiment described above, gas is supplied after the cleaning liquid is supplied for performing the drying treatment in the cleaning and drying unit CDU. However, such an embodiment is not limitative in the present invention. For example, an organic solvent may be supplied instead of gas for performing the dry treatment. In this case, an organic solvent having a low boiling point is preferable. Specifically, isopropyl alcohol (IPA) is cited as one example.

Figure 20:
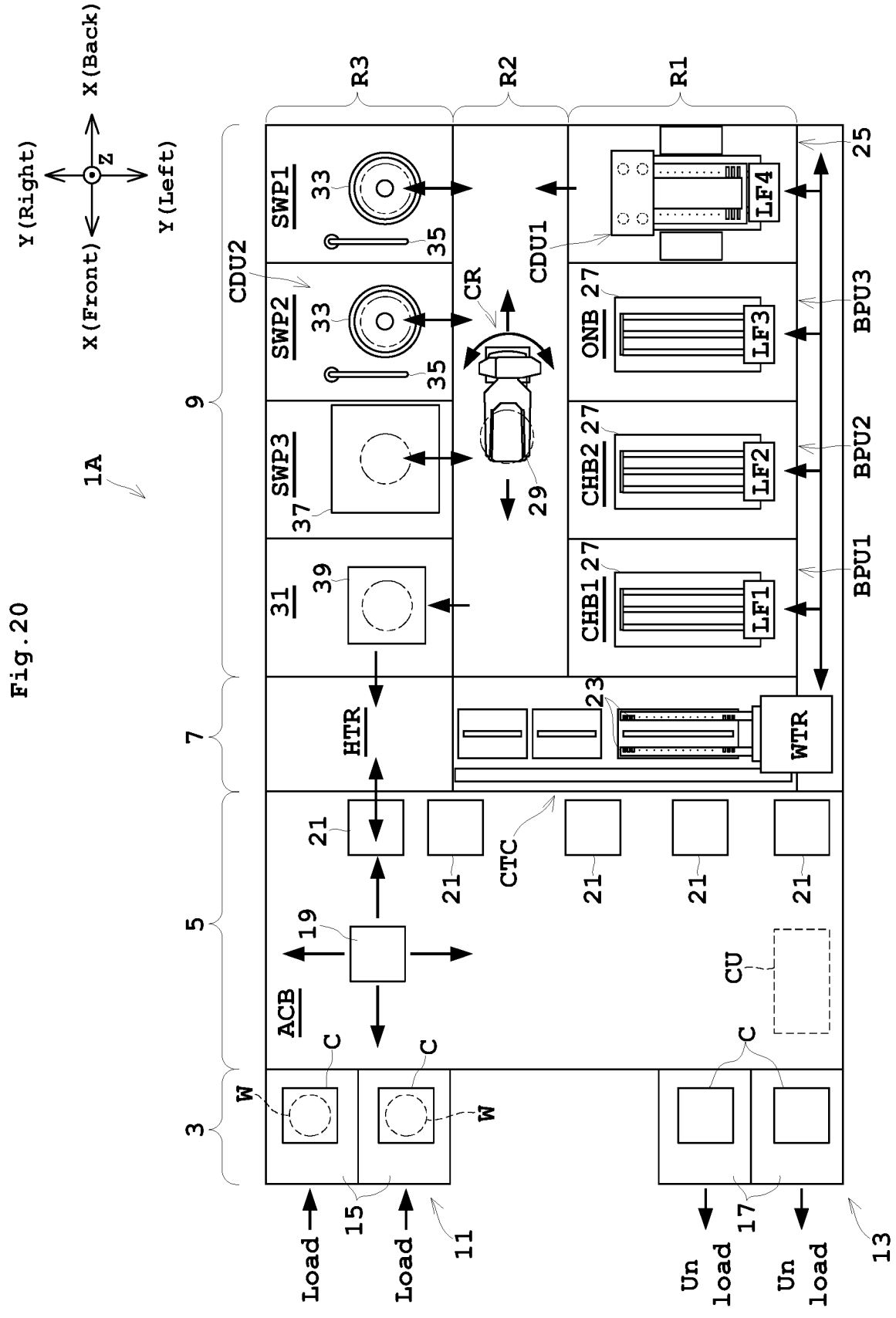
FIG. 20 is a plan view of the substrate treating apparatus according to the modification.

(6) In the embodiment described above, such a substrate treating apparatus 1 has been described as an example that includes only one cleaning and drying unit CDU. However, the present invention is not limitative to this configuration. Now description is made of a substrate treating apparatus 1A as one modification with reference to FIG. 20. FIG. 20 is a plan view of one modification of the substrate treating apparatus.

The substrate treating apparatus 1A includes a first cleaning and drying unit CDU1 and a second cleaning and drying unit CDU2. The first cleaning and drying unit CDU1 is located above the underwater posture turning unit 25, as is described in the embodiment. The second cleaning and drying unit CDU2 is also served as the second single-wafer processing unit SWP2, as is described in the modification. In other words, the first cleaning and drying unit CDU1 and the second cleaning and drying unit CDU2 are arranged across the second line R2 in the transverse direction Y. The first cleaning and drying unit CDU1 and the second cleaning and drying unit CDU2 are shifted in the front-back direction X. The first cleaning and drying unit CDU1 and the second cleaning and drying unit CDU2 are located at different positions in plan view.

With such a configuration, the center robot CR can cause the hand 29 to be cleaned and dried with any of the first cleaning and drying unit CDU1 and the second cleaning and drying unit CDU2. In the case of the configuration described above, the control unit CU preferably performs control as under.

That is, the control unit CU can recognize a current position of the center robot CR. In addition, the control unit CU stores positions of the first cleaning and drying unit CDU1 and the second cleaning and drying unit CDU2. Accordingly, the control unit CU can determine which of the first cleaning and drying unit CDU1 or the second cleaning and drying unit CDU2 the center robot CR is currently closer to. When cleaning and drying treatment is performed on the hand 29 of the center robot CR, the control unit CU selects either the first cleaning and drying unit CDU1 or the second cleaning and drying unit CDU2 that is closer to the hand 29, and moves the center robot CR to the closer cleaning and drying unit. Such control can achieve rapid cleaning of the hand 29. This hardly generates residues due to the deionized water adhered to the hand 29. Moreover, the substrates W can be transported from the supercritical fluid chamber 37 rapidly, leading to enhanced throughput.

Alternatively, three or more cleaning and drying unit CDU may be provided at different positions.

(7) In the embodiment and the modification described above, the substrate treating apparatus 1 and 1A each provided with the underwater posture turning unit 25 have been described as an example. However, the underwater posture turning unit 25 is not essential in the present invention. That is, such a configuration is adoptable that is provided with a posture turning unit configured to turn a posture of substrates W from a vertical posture to a horizontal posture and a nozzle configured to spray deionized water to a substrate W whose posture is to be turned.

(8) In the embodiment and the modification described above, such a substrate treating apparatus 1 and 1A have been described as an example that includes the configuration shown in FIGS. 1 and 20. However, the present invention is not limitative to this configuration. That is, the stocker block 5, the first transport mechanism HTR, and the transferring mechanism CTC are not essential.

The present invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating apparatus that performs treatment on a substrate, the apparatus comprising:
    a batch-type processing unit configured to perform treatment on a plurality of substrates in a vertical posture collectively;
    a single-wafer-type processing unit configured to perform treatment on one substrate of the plurality of substrates in a horizontal posture;
    a posture turning unit configured to hold the substrates on which the treatment is performed by the batch-type processing unit, and to turn a posture of the substrates from vertical to horizontal while the substrates get wet with deionized water;
    a first transport unit configured to transport the substrates, on which the treatment is performed by the batch-type processing unit, to the posture turning unit;
    a second transport unit comprising a hand configured to transport the substrates, turned to horizontal by the posture turning unit, to the single-wafer-type processing unit, and configured to transport the substrates, on which the treatment is performed by the single-wafer processing unit, with the hand out of the single-wafer-type processing unit; and
    a cleaning and drying unit configured to perform cleaning and drying treatment on the hand of the second transport unit.

2. The substrate treating apparatus according to claim 1, wherein
    the cleaning and drying unit performs the cleaning and drying treatment on the hand before the second transport unit transports the substrates, on which the treatment is performed by the single-wafer processing unit, out of the single-wafer-type processing unit.

3. The substrate treating apparatus according to claim 2, wherein
    the cleaning and drying unit performs the cleaning and drying treatment on the hand after the substrates are transported from the posture turning unit to the single-wafer-type processing unit.

4. The substrate treating apparatus according to claim 3, wherein the cleaning and drying unit is arranged above the posture turning unit.

5. The substrate treating apparatus according to claim 4, wherein an interior of the cleaning and drying unit and an interior of the posture turning unit are in fluid communication with each other in a vertical direction.

6. The substrate treating apparatus according to claim 2, wherein the cleaning and drying unit is arranged above the posture turning unit.

7. The substrate treating apparatus according to claim 6, wherein an interior of the cleaning and drying unit and an interior of the posture turning unit are in fluid communication with each other in a vertical direction.

8. The substrate treating apparatus according to claim 2, wherein the cleaning and drying unit includes a cleaning liquid nozzle configured to eject a cleaning liquid to the hand, and a drying mechanism configured to dry the hand.

9. The substrate treating apparatus according to claim 1, wherein the cleaning and drying unit performs the cleaning and drying treatment on the hand after the substrates are transported from the posture turning unit to the single-wafer-type processing unit.

10. The substrate treating apparatus according to claim 9, wherein the cleaning and drying unit is arranged above the posture turning unit.

11. The substrate treating apparatus according to claim 10, wherein an interior of the cleaning and drying unit and an interior of the posture turning unit are in fluid communication with each other in a vertical direction.

12. The substrate treating apparatus according to claim 9, wherein the cleaning and drying unit includes a cleaning liquid nozzle configured to eject a cleaning liquid to the hand, and a drying mechanism configured to dry the hand.

13. The substrate treating apparatus according to claim 1, wherein the cleaning and drying unit is arranged above the posture turning unit.

14. The substrate treating apparatus according to claim 13, wherein an interior of the cleaning and drying unit and an interior of the posture turning unit are in fluid communication with each other in a vertical direction.

15. The substrate treating apparatus according to claim 14, wherein the cleaning and drying unit includes a cleaning liquid nozzle configured to eject a cleaning liquid to the hand, and a drying mechanism configured to dry the hand.

16. The substrate treating apparatus according to claim 13, wherein the cleaning and drying unit includes a cleaning liquid nozzle configured to eject a cleaning liquid to the hand, and a drying mechanism configured to dry the hand.

17. The substrate treating apparatus according to claim 1, wherein the cleaning and drying unit includes a cleaning liquid nozzle configured to eject a cleaning liquid to the hand, and a drying mechanism configured to dry the hand.

18. The substrate treating apparatus according to claim 17, wherein the drying mechanism is a gas nozzle configured to supply gas to the hand.

19. The substrate treating apparatus according to claim 1, wherein the single-wafer-type processing unit includes a spin chuck configured to support the substrate rotatably in a horizontal posture, a treatment liquid supplying mechanism configured to supply a treatment liquid to the substrate supported by the spin chuck, and a gas supplying mechanism configured to supply gas on the substrate supported by the spin chuck, and the cleaning and drying unit performs cleaning and drying treatment to the hand with use of the treatment liquid supplying mechanism and the gas supplying mechanism of the single-wafer-type processing unit.

20. The substrate treating apparatus according to claim 1, further comprising:

a plurality of the cleaning and drying units arranged in different positions in plan view, wherein one of the cleaning and drying units that is closest to the hand performs cleaning and drying treatment in accordance with a position of the second transport unit.

* * * * *